United States Patent
Mok et al.

(10) Patent No.: US 7,579,583 B2
(45) Date of Patent: Aug. 25, 2009

(54) SOLID-STATE IMAGING APPARATUS, WIRING SUBSTRATE AND METHODS OF MANUFACTURING THE SAME

(75) Inventors: Seung-Kon Mok, Suwon-si (KR); Young-Hoon Ro, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/976,792

(22) Filed: Nov. 1, 2004

(65) Prior Publication Data

US 2005/0116142 A1 Jun. 2, 2005

(30) Foreign Application Priority Data

Dec. 2, 2003 (KR) .................... 10-2003-0086828

(51) Int. Cl.
*H01J 40/14* (2006.01)
(52) U.S. Cl. ........................................ 250/239; 438/64
(58) Field of Classification Search ............. 250/208.1, 250/239; 438/64, 108, 110–111, 116; 257/432–434, 257/53
See application file for complete search history.

(56) References Cited

U.S. PATENT DOCUMENTS

| | | | | |
|---|---|---|---|---|
| 5,436,492 | A * | 7/1995 | Yamanaka | 257/433 |
| 5,998,862 | A * | 12/1999 | Yamanaka | 257/704 |
| 6,458,609 | B1 * | 10/2002 | Hikita et al. | 438/15 |
| 6,483,652 | B2 | 11/2002 | Nakamura | |
| 6,545,332 | B2 | 4/2003 | Huang | |
| 6,696,738 | B1 * | 2/2004 | Tu et al. | 257/433 |
| 6,747,261 | B1 * | 6/2004 | Hsieh et al. | 250/208.1 |
| 7,148,529 | B2 * | 12/2006 | Oida et al. | 257/294 |
| 2001/0050721 | A1 * | 12/2001 | Miyake | 348/374 |
| 2002/0175387 | A1 * | 11/2002 | Nakanishi et al. | 257/433 |
| 2003/0052381 | A1 * | 3/2003 | Andoh et al. | 257/433 |
| 2003/0073142 | A1 * | 4/2003 | Chen et al. | 435/7.21 |
| 2003/0155639 | A1 * | 8/2003 | Nakamura et al. | 257/680 |
| 2003/0193018 | A1 * | 10/2003 | Tao et al. | 250/239 |
| 2004/0084741 | A1 * | 5/2004 | Boon et al. | 257/433 |
| 2004/0113221 | A1 * | 6/2004 | Hsieh et al. | 257/433 |
| 2004/0157372 | A1 * | 8/2004 | Manatad | 438/108 |
| 2004/0166763 | A1 * | 8/2004 | Hanada et al. | 445/51 |
| 2004/0178502 | A1 * | 9/2004 | Ishikawa et al. | 257/737 |

FOREIGN PATENT DOCUMENTS

| | | |
|---|---|---|
| CN | 2585417 Y | 11/2003 |
| JP | 2002-62462 | 2/2002 |
| KR | 2002-0087769 | 11/2002 |
| KR | 2003-87528 | 11/2003 |

OTHER PUBLICATIONS

Korean Office Action dated Aug. 29, 2005, with English Translation.
Chinese Patent Office Action dated Oct. 26, 2007, for corresponding Chinese Patent Application No. 2004-100982270, with English translation thereof.

* cited by examiner

*Primary Examiner*—Georgia Y Epps
*Assistant Examiner*—Kevin Wyatt
(74) *Attorney, Agent, or Firm*—Harness, Dickey & Pierce

(57) ABSTRACT

A size reduced solid-state imaging apparatus may be provided. The solid-state imaging apparatus may include a wiring substrate having a body having a cavity on an area which a semiconductor chip may be mounted, a lead that may project inward into the cavity from the internal side of the body, and/or a tie bar.

60 Claims, 19 Drawing Sheets

SOLID-STATE IMAGING APPARATUS, WIRING SUBSTRATE AND METHODS OF MANUFACTURING THE SAME

CROSS REFERENCE TO RELATED APPLICATIONS

This application claims the priority of Korean Patent Application No. 10-2003-0086828 filed on Dec. 2, 2003 with the Korean Intellectual Property Office, the disclosure of which is incorporated herein in its entirety by reference.

Field of the Invention

The present invention relates to a solid-state imaging apparatus, a wiring substrate and methods of manufacturing the same. More particularly, exemplary embodiments of the present invention may be directed to a solid-state imaging apparatus, which may include a wiring substrate, in which a semiconductor chip, may be electrically connected to a lead which may project from a body.

Description of the Conventional Art

Conventional camera modules may utilize a solid-state imaging semiconductor chip and a lens which may be mounted on mobile apparatuses such as a mobile terminal or phone. A mobile phone may allow a caller to capture an image in the form of image data through a small camera and to transmit the image data to the receiver.

As mobile phones and portable personal computers ("portable PCs") become more compact, there may also be a need to reduce the size of the camera module which may be used in the mobile phone or portable PC.

Referring to FIG. 1, a camera module which may include a lens unit 110, in which a solid-state imaging lens 115 and an IR cut filter 120 may be installed, may be bonded to a portion of the top surface of a board 150 with an adhesive. A semiconductor chip 130 may comprise a group of photoelectric conversion elements which may convert light from the solid-state imaging lens 115 into an image signal. The semiconductor chip 130 may be positioned on the board 150 and may be wire-bonded to a substrate pad which may be formed at a portion of the top surface of the board 150.

An image processing semiconductor chip 140 may be wire-bonded to a substrate pad which may be formed at a portion of the bottom surface of the board 150. The image processing semiconductor chip 140 may be sealed using an insulating sealing resin 160 which may be fabricated by a transfer mold technique. The image processing semiconductor chip 140 may process the image signal from the semiconductor chip 130.

The board 150 and a flexible cable 170 may be electrically connected to each other by means of a cable junction 175. The semiconductor chip 130 and the image processing semiconductor chip 140 may be bonded to the top and bottom surfaces of the board 150 and may be electrically connected thereto through bonding wires 135 and 145, and the solid-state imaging apparatus may be manufactured easier and the assembling costs may be reduced. The image processing semiconductor chip 140 and the insulating sealing resin 160 which may be formed below the board 150, may cause the camera module to become thicker.

SUMMARY OF THE INVENTION

Exemplary embodiments of the present invention may provide a wiring substrate which may provide a thinner, size reduced solid-state imaging apparatus, and methods for manufacturing the same.

An exemplary embodiment of the present invention, may provide a wiring substrate which may comprise a cavity, formed within a body, in which a semiconductor chip may be mounted. An end of a lead may project into the cavity from an internal side of the body and another end of the lead may be connected to a bottom portion of the body.

Another exemplary embodiment of the present invention, may provide a wiring substrate which may comprise a cavity, formed within a body, in which a semiconductor chip may be mounted, and a stepped portion, which may be formed on an internal surface of the body. A first lead may comprise an end which may project into the cavity from an internal side of the body and another end which may be connected to a bottom portion of the body. A second lead may comprise an end which may project into the cavity from the stepped portion of the body and another end which may connect to a bottom portion of the body.

Another exemplary embodiment of the present invention, may provide a solid-state imaging apparatus which may comprise a lens unit capable of holding a solid-state imaging lens, and a wiring substrate which may comprise a cavity, formed within a body, in which a semiconductor chip may be mounted. An end of a lead may project into the cavity from an internal side of the body and another end of the lead may be connected to a bottom portion of the body. The wiring substrate may be connected to the lens unit such that the solid-state imaging lens and the cavity may face each other, and the semiconductor chip, which may be electrically connected to an end of the lead, may convert light from the solid-state imaging lens into an image signal and/or process the image signal.

Another exemplary embodiment of the present invention, may provide a solid-state imaging apparatus which may comprise a lens unit capable of holding a solid-state imaging lens, and a wiring substrate which may include a cavity, formed within a body, in which a first and a second semiconductor chip may be mounted, and a stepped portion which may be formed on an internal surface of the body. A first lead may include an end which may project into the cavity from the internal surface of the body and another end of the first lead may be connected to a bottom portion of the body. A second lead may include an end which may project into the cavity from the stepped portion of the body and another end of the second lead may be connected to a bottom portion of the body. The first semiconductor chip may be postitioned within the cavity, may be electrically connected to an end of the first lead, and may convert light from the solid-state imaging lens into an image signal. The second semiconductor chip may be positioned under the first semiconductor chip, may be electrically connected to an end of the second lead, and may process the image signal.

Another exemplary embodiment of the present invention may provide a wiring substrate which may comprise a cavity, formed within a body, in which at least one semiconductor chip may be positioned. At least one end of a lead may project into the cavity from at least one of an internal side and a top portion of the body and another end may be connected to a bottom portion of the body.

Another exemplary embodiment of the present invention may provide a solid-state imaging apparatus which may comprise a lens unit capable of holding a solid-state imaging lens and a wiring substrate. The wiring substrate may comprise a cavity, formed within a body, in which at least one semiconductor chip may be positioned. At least one end of a lead may project into the cavity from at least one of an internal side and a top portion of the body. Another end of the at least one lead may be connected to a bottom portion of the body.

Another exemplary embodiment may provide a method for manufacturing a wiring substrate. The method may comprise forming a cavity within a body, mounting at least one semiconductor chip, within the cavity, on the body and forming at least one lead on the body. At least a first end of the at least one lead may project into the cavity from at least one of an internal side and a top portion of the body, and at least a second end of the lead may be connected to a bottom portion of the body.

In exemplary embodiments of the present invention at least one lead and/or tie bar may fixedly position the semiconductor chip within the cavity.

In exemplary embodiments of the present invention at least one semiconductor chip may be comprised of at least one of a solid-state semiconductor chip, solid-state image processing semiconductor chip, and combination solid-state semiconductor chip and solid-state image processing semiconductor chip.

BRIEF DESCRIPTION OF THE DRAWINGS

Other features and advantages of exemplary embodiments of the present invention are incorporated into the following more detailed description and the accompanying drawings in which.

DETAILED DESCRIPTION OF THE
EXEMPLARY EMBODIMENTS OF THE
PRESENT INVENTION

Exemplary embodiments of the present invention will be described in detail with reference to the accompanying drawings such that those of ordinary skill in the art may more easily embody the present invention.

Figure 1:
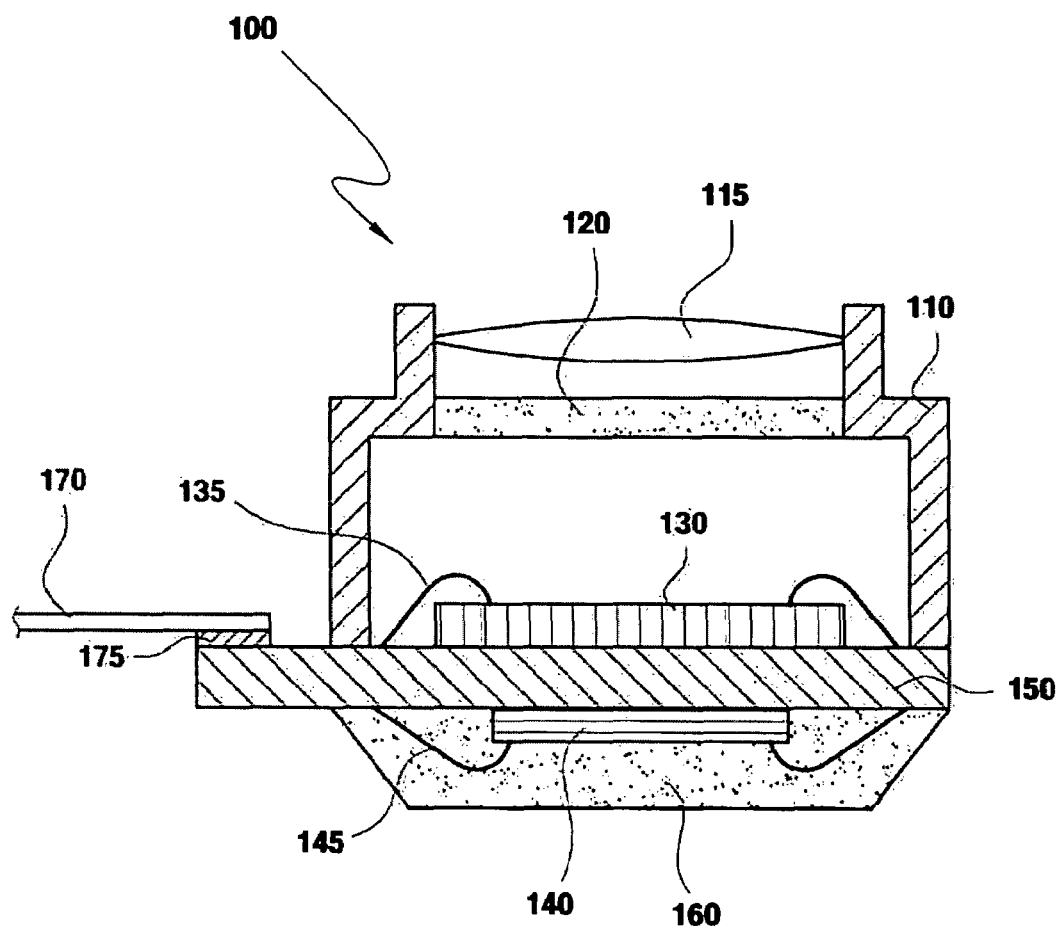
FIG. 1 is a cross-sectional diagram schematically showing a conventional solid-state imaging apparatus.
Figure 2A:
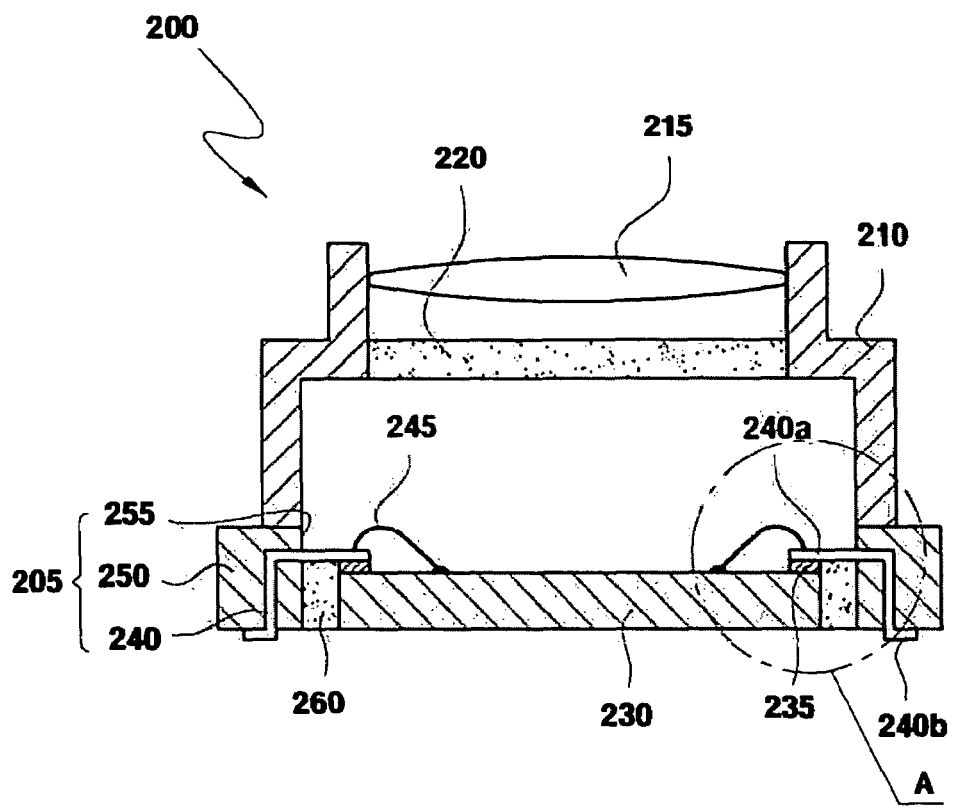
FIG. 2A is a cross-sectional view of a solid-state imaging apparatus according to an exemplary embodiment of the present invention.
Figure 2B:
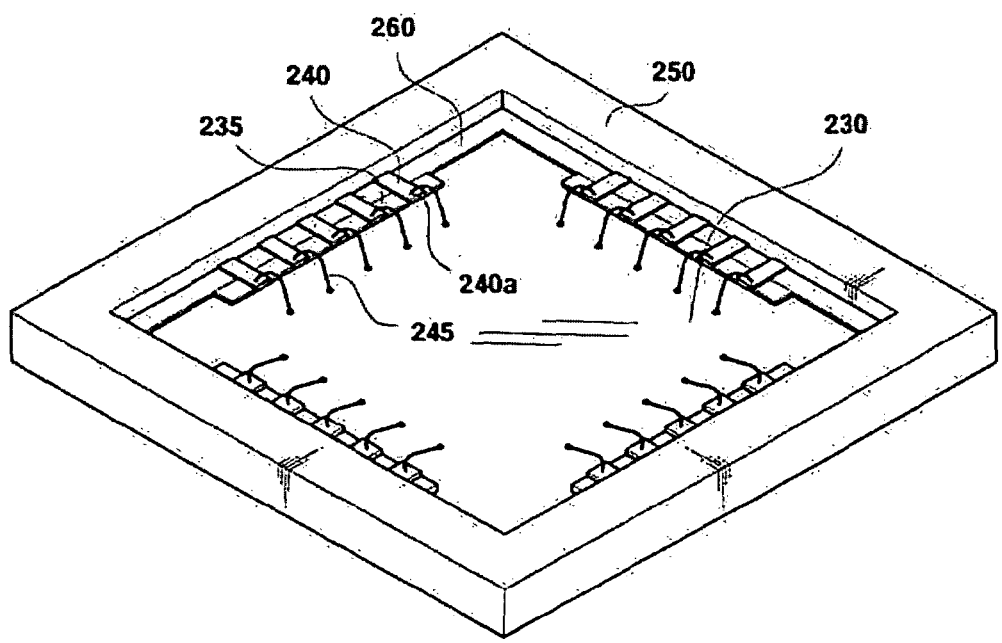
FIG. 2B is a perspective view illustrating an example of an electrical connection between a semiconductor chip and a body shown in FIG. 2A.
Figure 2C:
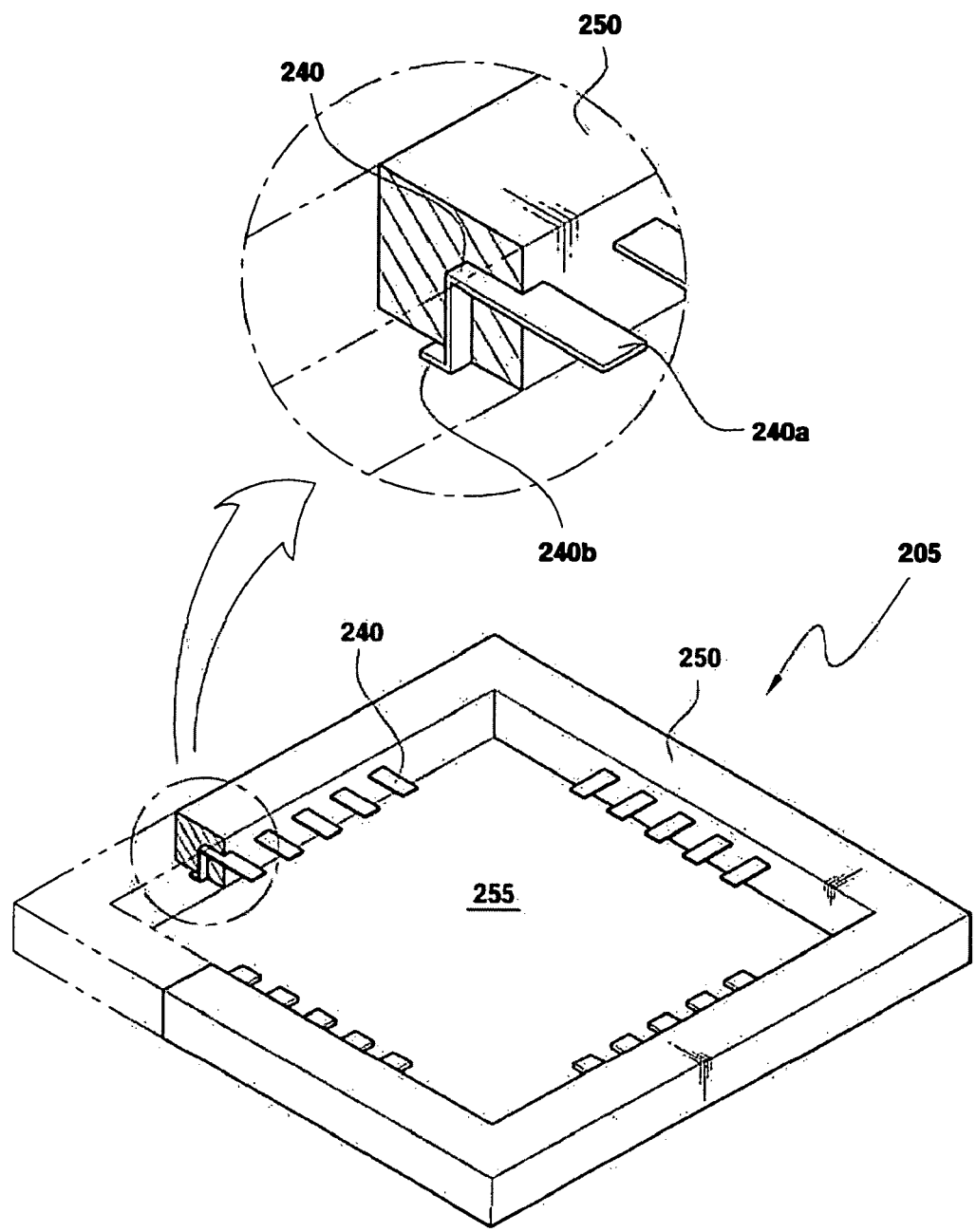
FIG. 2C is a partly exploded perspective view of a wiring substrate shown in FIG. 2A.

As shown in FIGS. 2A through 2C, the solid-state imaging apparatus 200 according to an exemplary embodiment of the present invention may include a lens portion 210 capable of holding a solid-state imaging lens 215, a wiring substrate 205 and a semiconductor chip 230.

The lens unit 210 may include a light receiving hole through which light may pass. Solid-state imaging lens 215 may be attached to the light receiving hole of the lens unit 210. An IR cut filter 220 and/or a high frequency cut filter, which may be spaced a distance apart from and/or positioned under the solid-state imaging lens 215 in the lens unit 210, may be installed such that light from the solid-state imaging lens 215 may pass through the filter.

The wiring substrate 205 may include a body 250 and a lead 240. The body 250 may be attached to the bottom of the lens unit 210 by an adhesive. The body 250 may include a cavity 255, formed therein, and positioned directly, or indirectly, below the solid-state imaging lens 215. The body may include a board (for example, a printed circuit board (PCB) or flexible PCB), ceramic leadless chip carrier, pre-molded leadless chip carrier and the like. An epoxy molding compound (EMC), for example, may be used as the pre-molded leadless chip carrier. The lead 240 may be formed through the body 250. An end 240a of the lead 240 may project into the cavity 255 from an internal surface of the body 250. Another end 240b of the lead 240 may be connected to a bottom portion of the body 250. The lead 240 may include Cu, Ni, Fe, or any alloy thereof. The lead 240 may be fabricated using etching, in which a base panel may be fabricated such that all but a portion thereof may be etched away, and/or stamping, in which a base panel may be formed by pressing a mold into a pattern. The lead 240 may be plated with a metal such as Ni, Au, and the like.

As illustrated in FIGS. 2A through 2C, the semiconductor chip 230 may be positioned directly, or indirectly, below the solid-state imaging lens 215 and placed in the cavity 255 of the body 250. The end 240a of the lead 240 may project into the cavity 255 from an internal surface of the body 250 and may be sealed to a portion (for example, a peripheral portion) of the top surface of the semiconductor chip 230 by a sealant 235. The semiconductor chip 230 may be bonded to the lead 240 and positioned within the cavity 255. An electrode pad (not shown), which may be formed on the top surface of the semiconductor chip 230, may be electrically connected, by an electrical connection 245, to the end 240a of the lead 240.

The semiconductor chip 230 may include a solid-state imaging device, an image processing semiconductor device, and/or a combination solid-state imaging and image processing semiconductor device.

The solid-state imaging device may include a group of photoelectric conversion elements which may convert light from the solid-state imaging lens 215 solid-state imaging lens 215 into an image signal. The solid-state imaging device may include, for example, a photoelectric conversion unit (sensor), a driving circuit, an analog-to-digital (A/D) converting unit, a signal processing unit, and a semiconductor circuit. The photoelectric conversion unit may include a group of photoelectric conversion elements arranged in a two-dimensional matrix, which may form a CMOS image sensor (CIS) unit. The driving circuit unit may drive (for example, sequentially) the photoelectric conversion elements and may obtain signal charges. The A/D converting unit may convert the signal charges into digital signals and the signal processing unit may process the digital signals to output image signals. The semiconductor circuit may include an exposure controller formed on the semiconductor chip. The exposure controller may control (for example, electrically) the exposure time based on the output level of the digital signal and the semiconductor chip may include a charged coupled device (CCD).

The image processing semiconductor chip may process an image signal output from the semiconductor chip.

The semiconductor chip 230 may form an image of an object on a sensor of the semiconductor chip 230 through the solid-state imaging lens 215 and the IR cut filter 220, may photoelectrically convert the object image and may output the converted image as an image signal in digital and/or analog form. The semiconductor chip 230 may process and output the image signal to the lead 240. The sensor of the semiconductor chip 230 may be positioned directly, or indirectly, below the solid-state imaging lens 215.

Figure 2D:
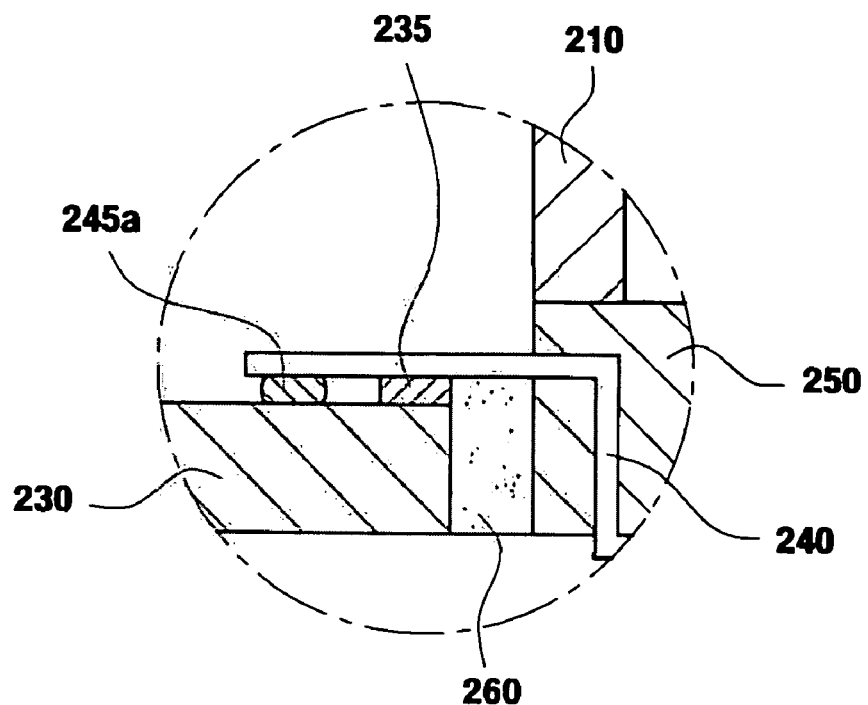
FIGS. 2D and 2E are views illustrating examples of modifications of a portion "A" shown in FIG. 2A.

As shown in FIG. 2B, the electrical connection 245, which may connect the one end 240 of the lead 240 to the electrode pad (not shown), may be formed on the top surface of the semiconductor chip 230 and may include at least one bonding wire. As shown in FIG. 2D, bumps and/or solder balls may be used as the electrical connection 245a.

Figure 2E:
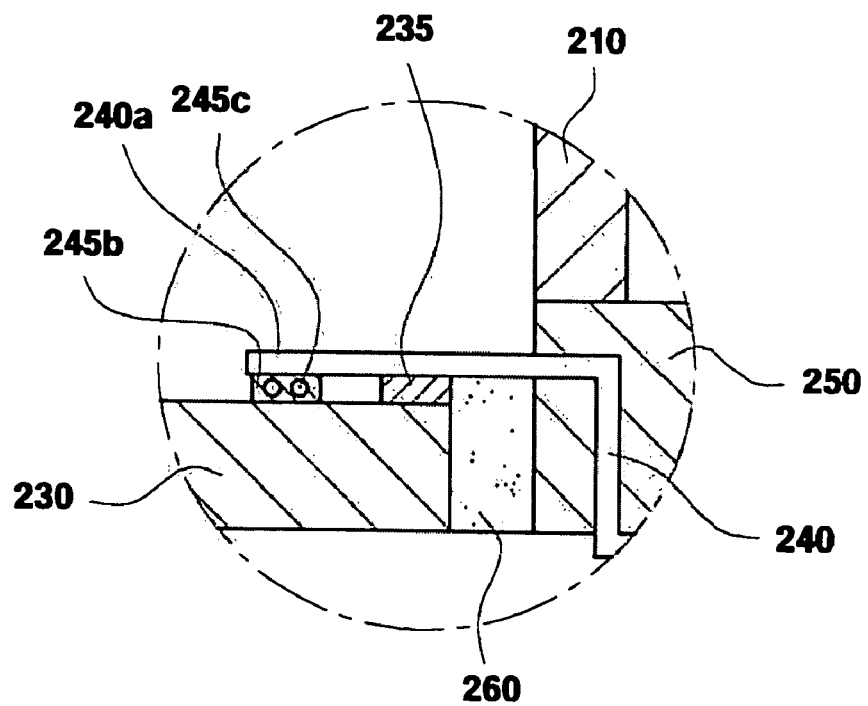

As illustrated in FIG. 2E, an anisotropic conductive film (ACF) 245b, an anisotropic conductive paste (ACP) 245c, or the like may be used as electrical connections. The end 240a of the lead 240 may be electrically connected to the electrode pad (not shown) by the conductive paste 245c contained in the insulating resin 240b.

A connected portion between the semiconductor chip 230 and the body 250 may be encapsulated by an insulating encapsulation resin 260. The insulating encapsulation resin 260 may increase the reliability and/or reinforce the strength of the electrically connected portion and may include epoxy resin, silicon resin, or the like. The end 240b of the lead 240, which may be formed below the body 250, may be electrically connected to a board (for example, a printed circuit board (PCB) or flexible PCB), and may electrically connect the solid-state imaging apparatus 200 to an external body.

The cavity 255 may be formed within the body 250, the semiconductor chip 230 may be placed in the cavity 255, and a size of the solid-state imaging apparatus 200 may be reduced (for example, in a vertical direction). The lead 240 may be electrically connected to the semiconductor chip 230, may be formed on the body 250 and may be formed on a portion projecting toward the semiconductor chip 230. There may not be a space for sealing the lead 240 and the semiconductor chip 230 on the body 250, and thus, a size of the body 250 may be reduced (for example, in a horizontal direction).

Figure 3A:
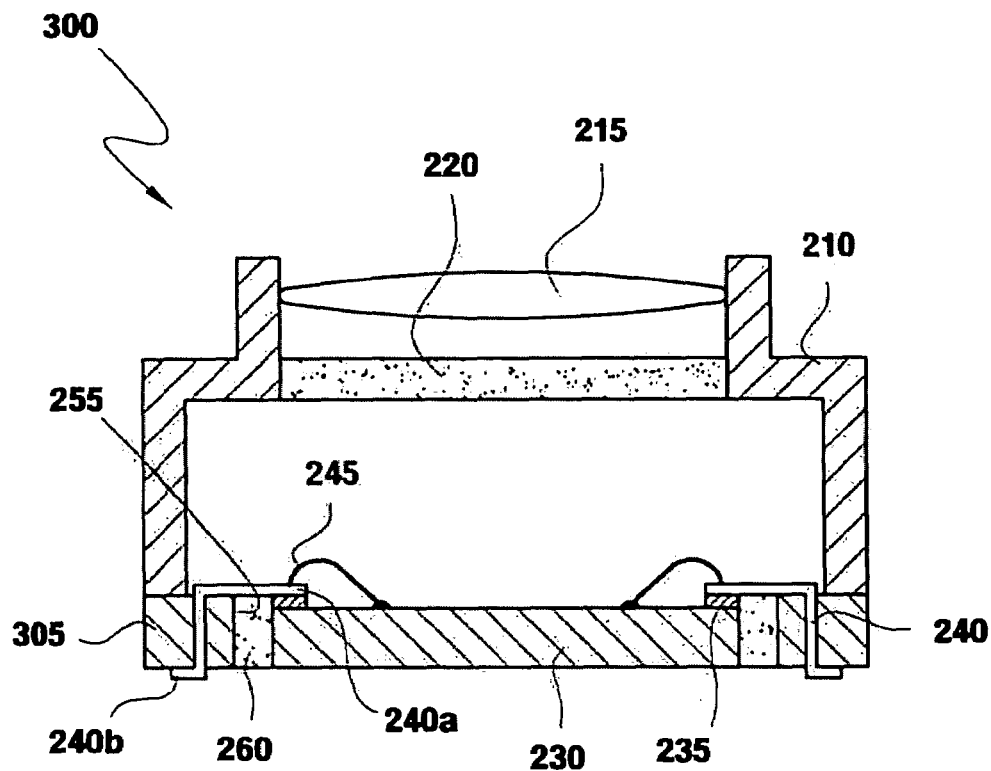
FIG. 3A is a cross-sectional view of a solid-state imaging apparatus according to another exemplary embodiment of the present invention.
Figure 3B:
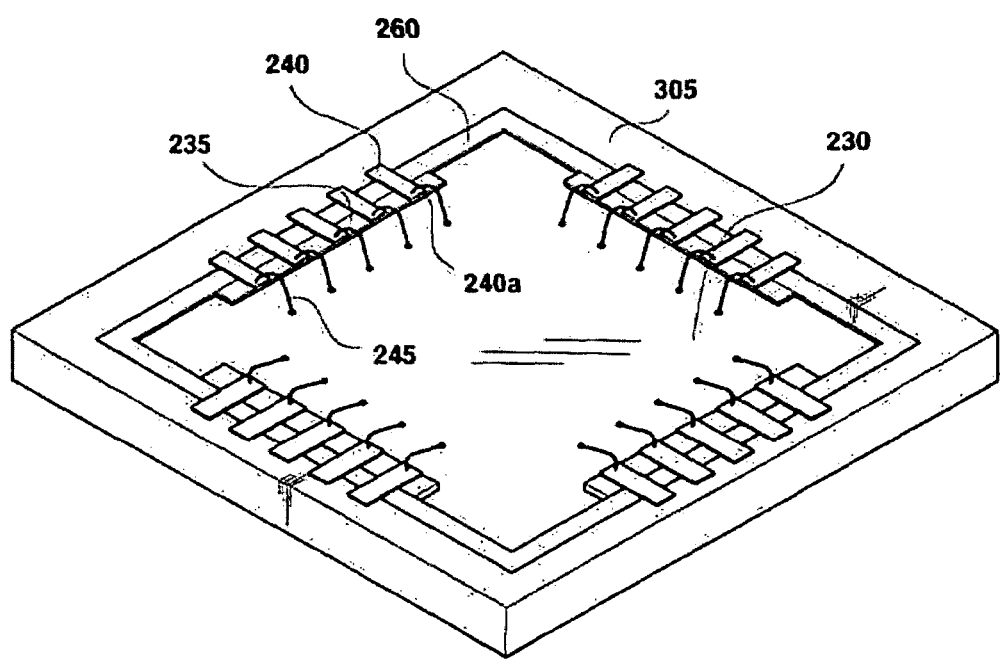
FIG. 3B is a perspective view illustrating an example of an electrical connection between a semiconductor chip and a body shown in FIG. 3A.

FIG. 3A is a cross-sectional view of a solid-state imaging apparatus 300 according to another exemplary embodiment of the present invention, and FIG. 3B is a perspective view illustrating an example of an electrical connection between the semiconductor chip 230 and the body 305 shown in FIG. 3A.

As illustrated in FIGS. 3A and 3B, a lead 240 may be formed through the inside of the body 305, an end 240a of the lead 240 may project from a top surface of the body 305 and may bend inward such that it may project inward into the cavity 255. Another end 240b of the lead 240 may be connected to a bottom portion of the body 305.

Bonding wires, bumps, solder balls, ACF and/or ACP, and the like may be used as electrical connection 245.

Figure 4A:
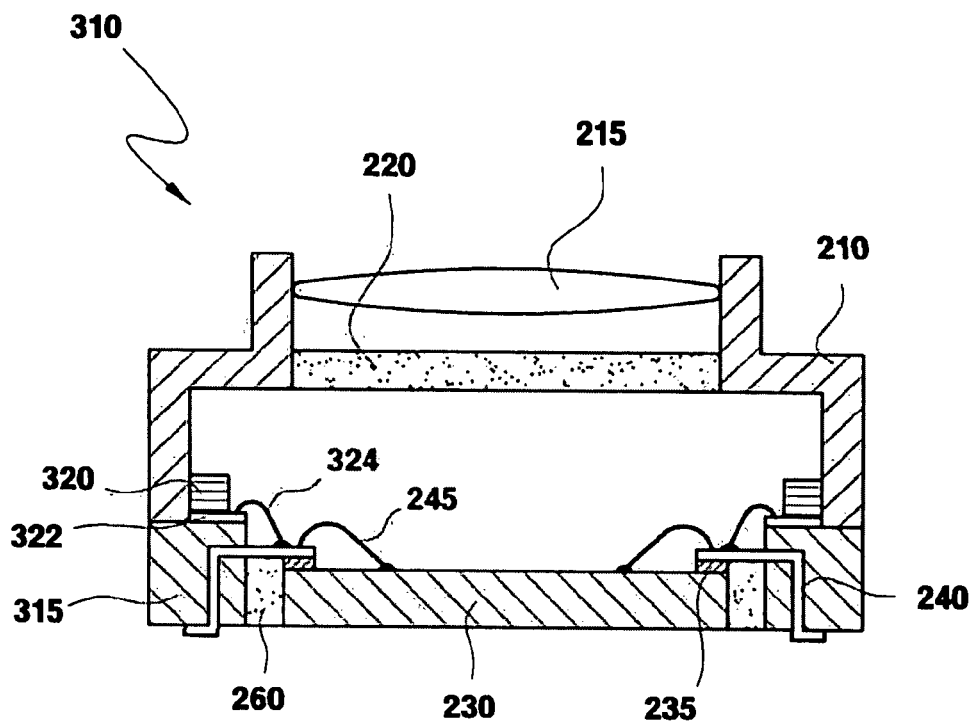
FIG. 4A is a cross-sectional view of a solid-state imaging apparatus according to a another exemplary embodiment of the present invention.
Figure 4B:
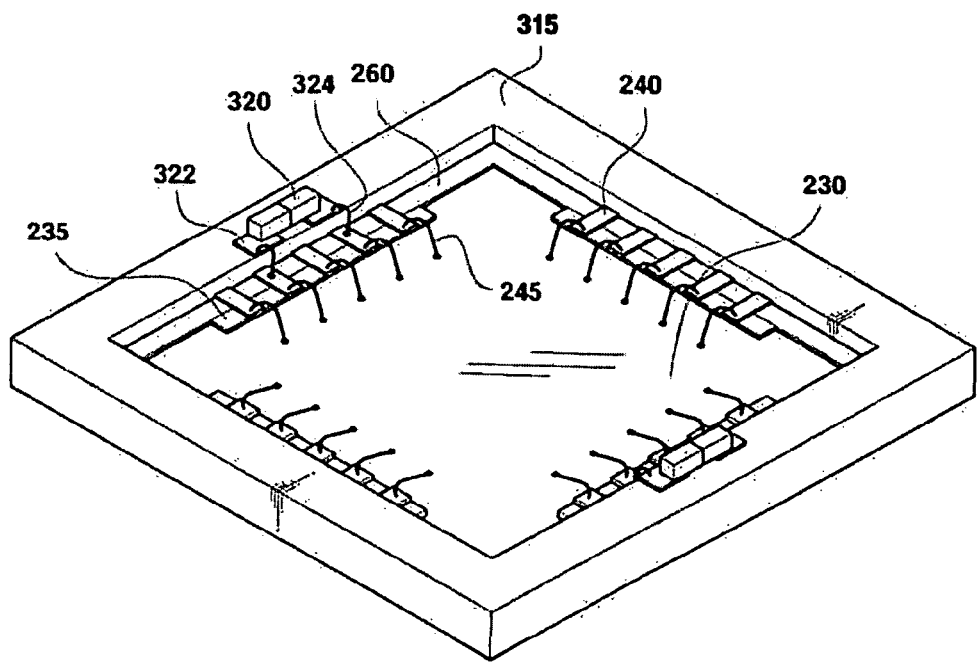
FIG. 4B is a perspective view illustrating an example of an electrical connection between a semiconductor chip and a body shown in FIG. 4A.

FIG. 4A is a cross-sectional view of a solid-state imaging apparatus 310 according to another exemplary embodiment of the present invention, and FIG. 4B is a perspective view illustrating an example of an electrical connection between the semiconductor chip 230 and the body 315 shown in FIG. 4A.

As illustrated in FIGS. 4A and 4B, a passive element 320 may be positioned inside a lens unit 210 on a top surface of the body 315. The passive element 320 may include a resistor, a capacitor, and/or an inductor. An electrode 322 may be formed beneath the passive element 320 and may be electrically connected to a lead 240 by a bonding wire 324.

Bonding wires, bumps, solder balls, ACF and/or ACP, and the like may be used as electrical connection 245.

Figure 5A:
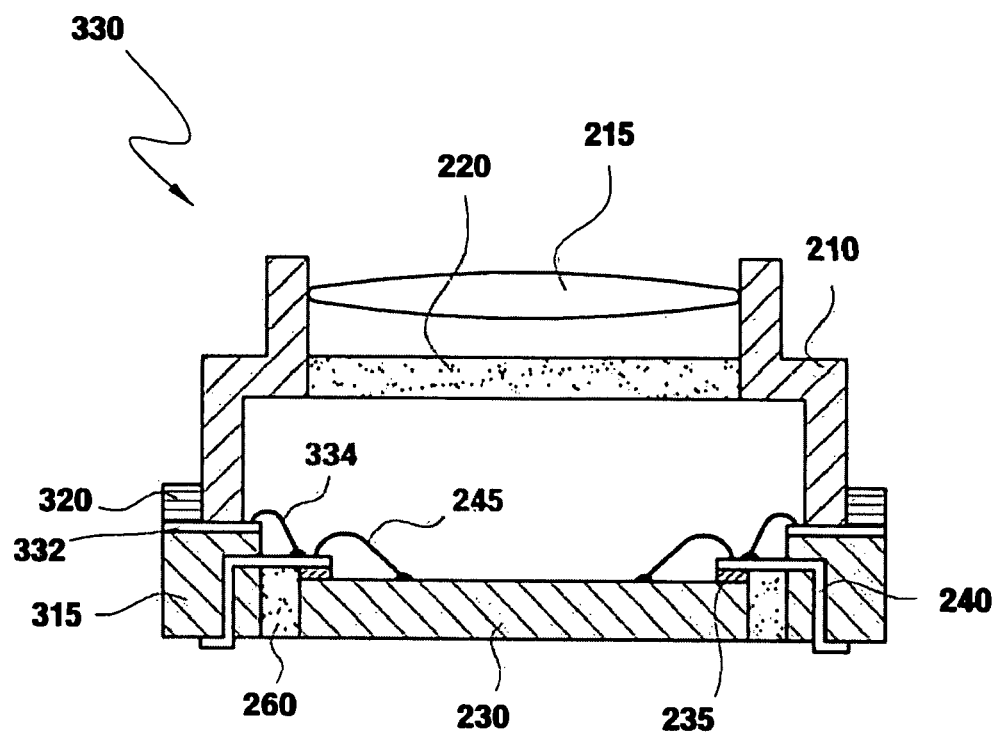
FIG. 5A is a cross-sectional view of a solid-state imaging apparatus according to another exemplary embodiment of the present invention.
Figure 5B:
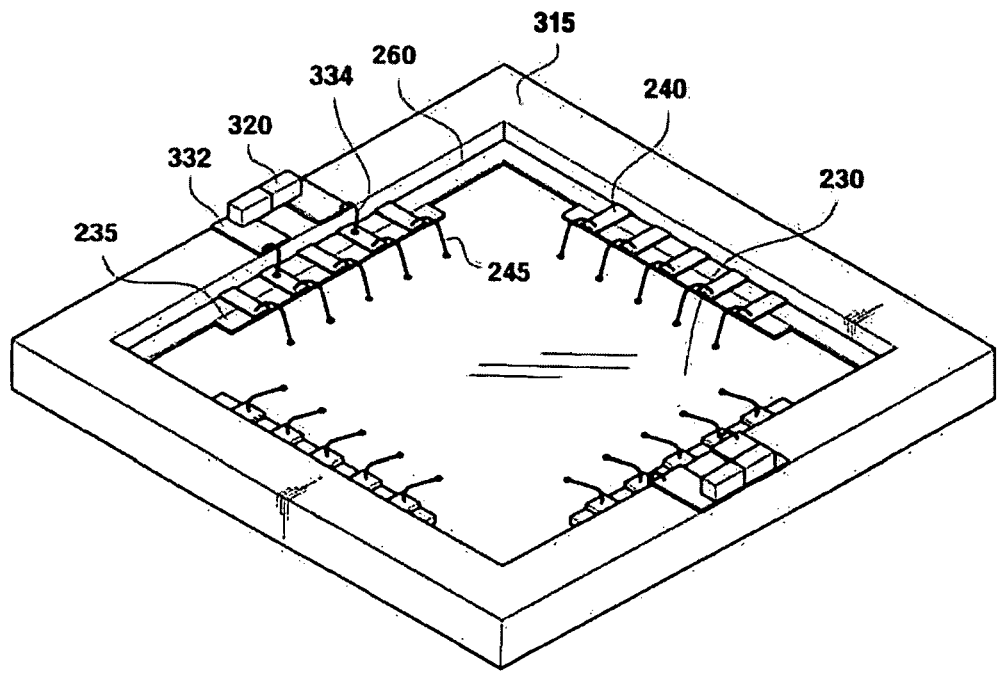
FIG. 5B is a perspective view illustrating an example of an electrical connection between a semiconductor chip and a body shown in FIG. 5A.

FIG. 5A is a cross-sectional view of a solid-state imaging apparatus 330 according to another exemplary embodiment of the present invention, and FIG. 5B is a perspective view illustrating an example of an electrical connection between the semiconductor chip 230 and the body 315 shown in FIG. 5A.

As illustrated in FIGS. 5A and 5B, a passive element 320 may be positioned outside a lens unit 210 on a top portion of the body 315. The passive element 320 may include a resistor, a capacitor, and/or an inductor. An electrode 322 may be formed beneath the passive element 320 and may be electrically connected to a lead 240 by a bonding wire 334.

Bonding wires, bumps, solder balls, ACF and/or ACP, and the like may be used as electrical connection 245.

Figure 6A:
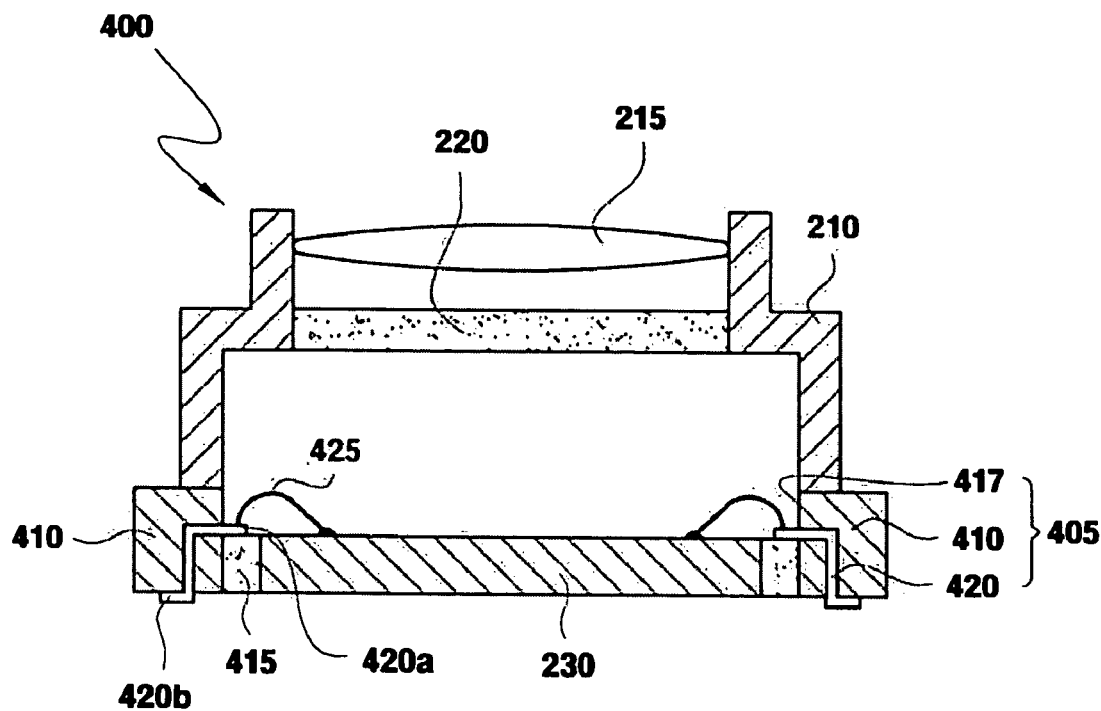
FIG. 6A is a cross-sectional view of a solid-state imaging apparatus according to another exemplary embodiment of the present invention.
Figure 6B:
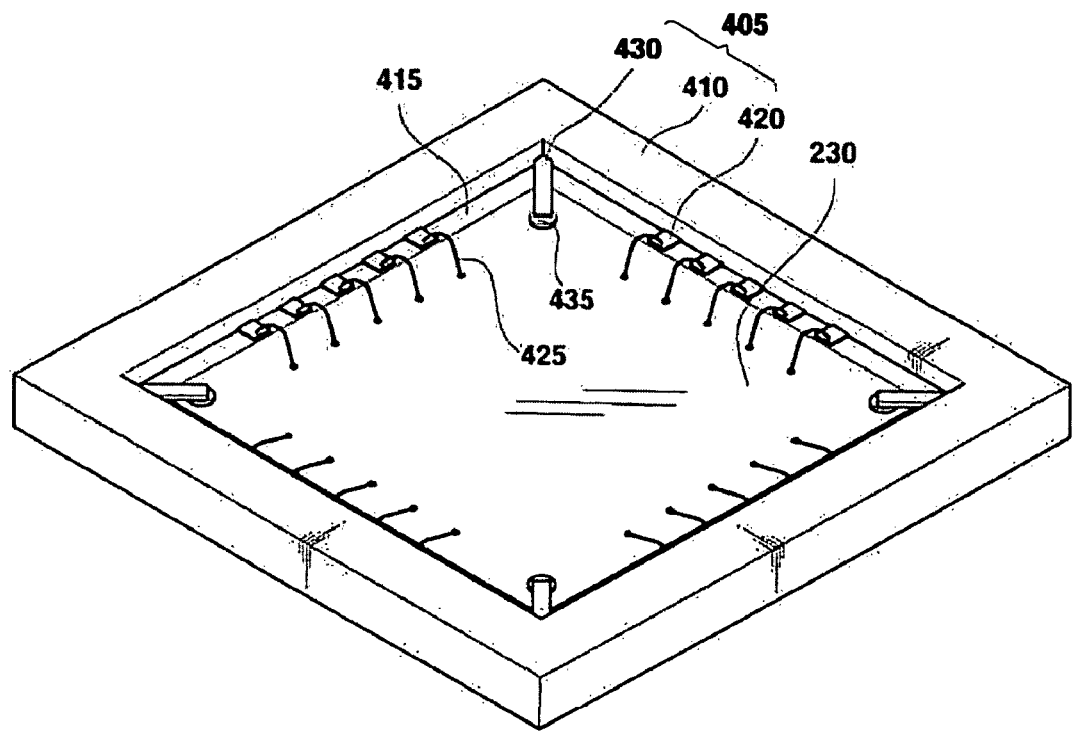
FIG. 6B is a perspective view illustrating an example of an electrical connection between a semiconductor chip and a body shown in FIG. 6A.
Figure 6C:
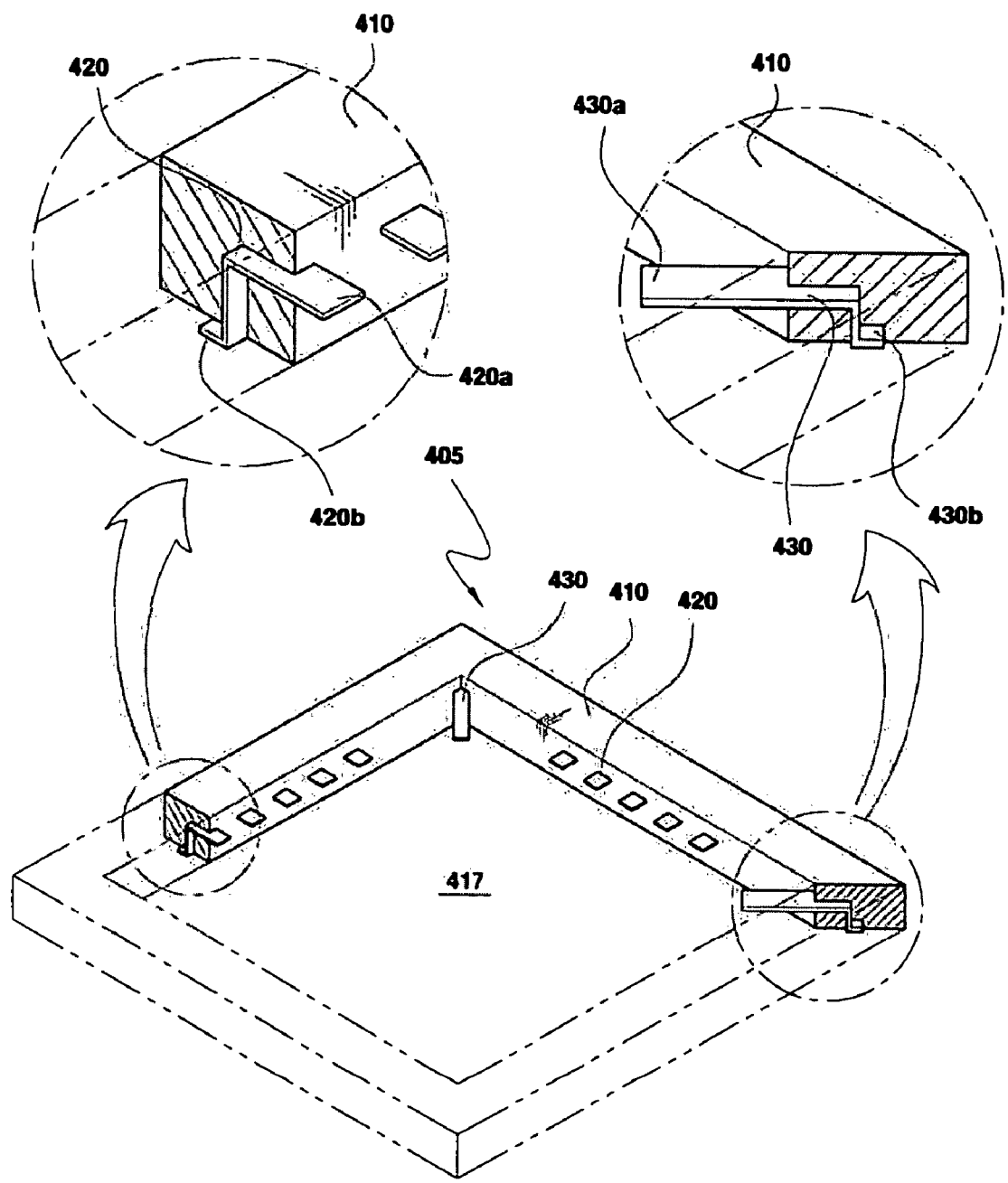
FIG. 6C is a perspective view of a wiring substrate shown in FIG. 6A.

FIG. 6A is a cross-sectional view of a solid-state imaging apparatus 400 according to another exemplary embodiment of the present invention, FIG. 6B is a perspective view illustrating an example of an electrical connection between the semiconductor chip 230 and the body 410 shown in FIG. 6A, and FIG. 6C is a perspective view of a wiring substrate 405 shown in FIG. 6A.

As illustrated in FIGS. 6B and 6C, the semiconductor chip 230 may be fixed into position by a tie bar 430. An end 430a of the tie bar 430 may project inward into a cavity 417 from an internal surface of the body 410, and an edge of the end 430a of the tie bar 430 may be bonded to a portion of the top surface of the semiconductor chip 230 by a sealant 435. An end 430b of the tie bar 430 may be positioned inside the body 410 and may fix the tie bar 430 into position. A wiring substrate 405 may include the body 410, a lead 420 and the tie bar 430. The tie bar 430 may be bonded to four corners of the semiconductor chip 230 and may overlap the lead 420. Tie bars may fix the semiconductor chip 230 into position on the body 410. The tie bar 430 may be formed at the same, or substantially the same, time as the lead 420, and may be formed of the same, or substantially the same, material.

The lead 420 may be formed through the body 410 and an end 420a of the lead 420 may project into the cavity 417. An end 420b of the lead 420 may be connected to a bottom portion of the body 410. The end 420a of the lead 420 may project toward a top surface of the semiconductor chip 230 and may not be bonded to the top surface of the semiconductor chip 230.

Bonding wires, bumps, solder balls, ACF or ACP, or the like may be used as electrical connection 425.

Figure 7A:
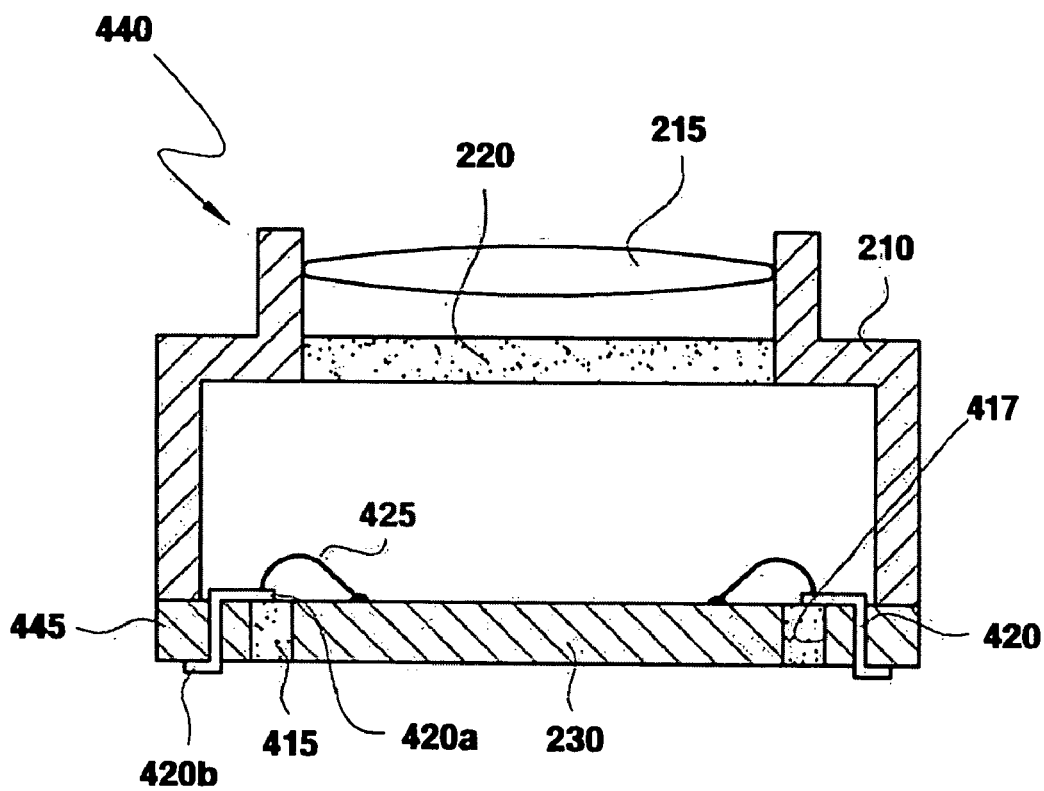
FIG. 7A is a cross-sectional view of a solid-state imaging apparatus according to another exemplary embodiment of the present invention.
Figure 7B:
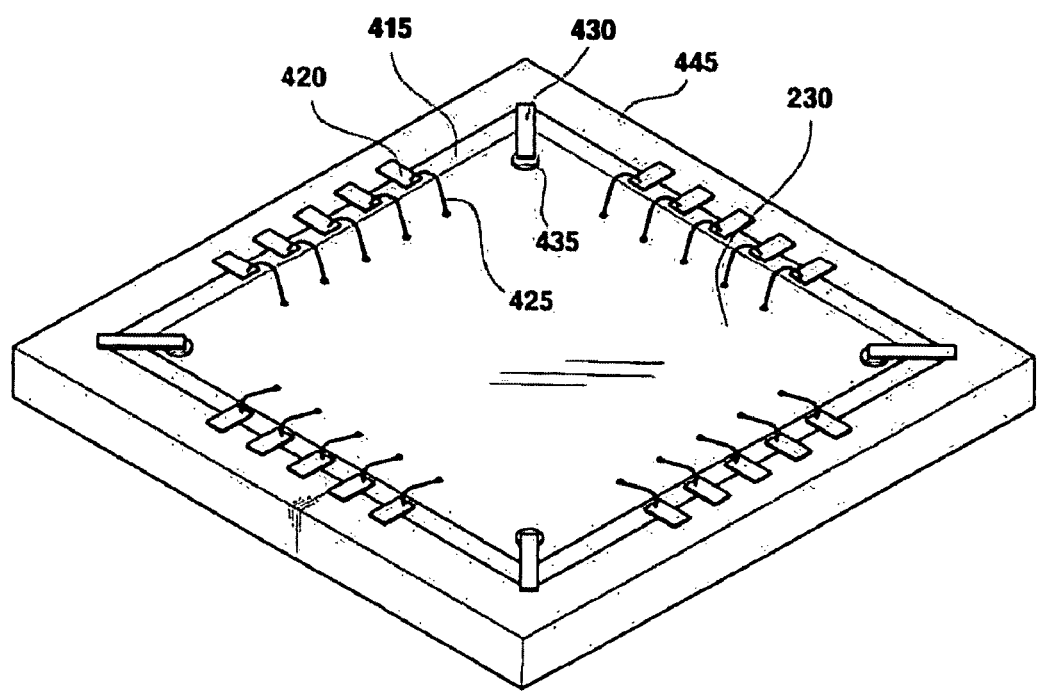
FIG. 7B is a perspective view illustrating an example of an electrical connection between a semiconductor chip and a body shown in FIG. 7A.

FIG. 7A is a cross-sectional view of a solid-state imaging apparatus 440 according to another exemplary embodiment of the present invention, and FIG. 7B is a perspective view illustrating an example of an electrical connection between the semiconductor chip 230 and the body 445 shown in FIG. 7A.

As illustrated in FIGS. 7A and 7B, a lead 420 may be formed through the body 445, an end 420a of the lead 420 may project from the top surface of the body 445 and may bend inward into a cavity 417. An end 420b of the lead 420 may be connected to a bottom portion of the body 445.

Bonding wires, bumps, solder balls, ACF or ACP may be used as electrical connection 425.

Figure 8A:
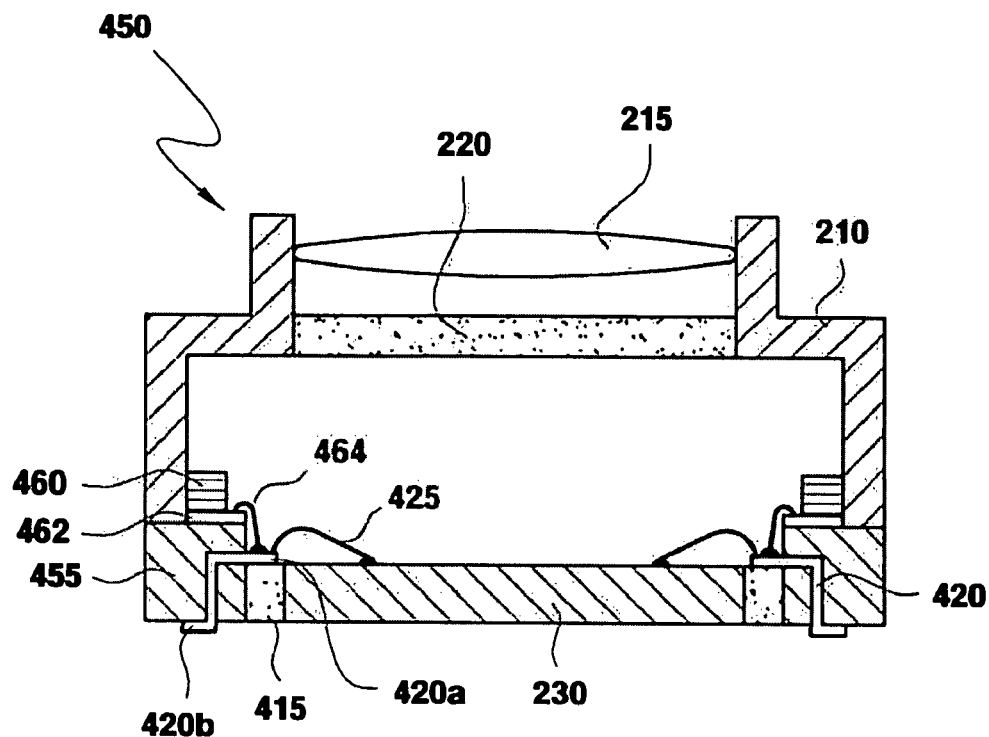
FIG. 8A is a cross-sectional view of a solid-state imaging apparatus according to another exemplary embodiment of the present invention.
Figure 8B:
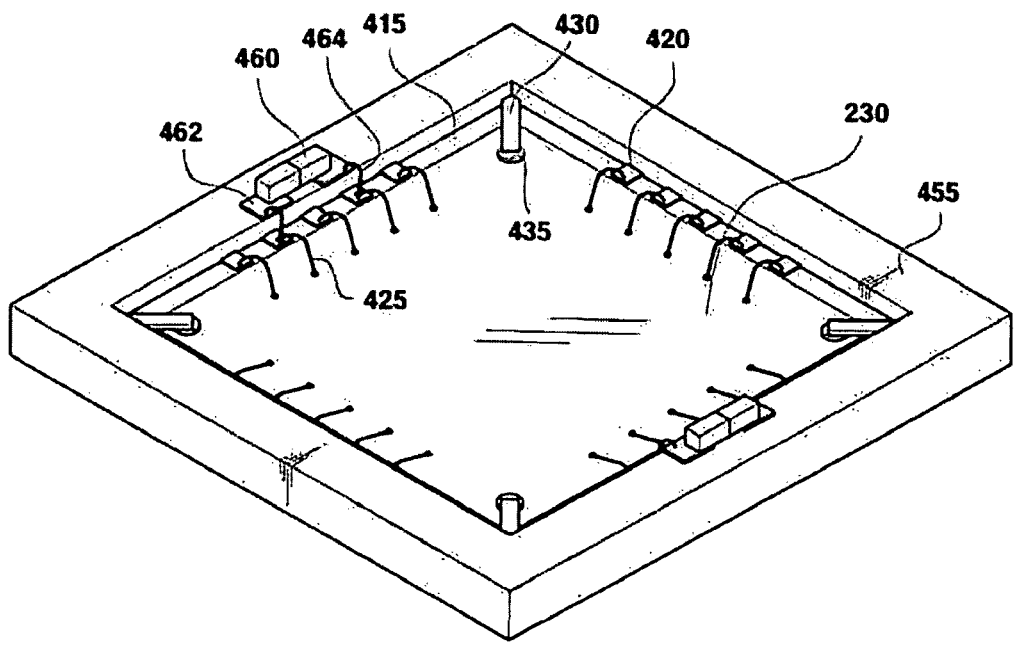
FIG. 8B is a perspective view illustrating an example of an electrical connection between a semiconductor chip and a body shown in FIG. 8A.

FIG. 8A is a cross-sectional view of a solid-state imaging apparatus 450 according to another exemplary embodiment of the present invention, and FIG. 8B is a perspective view illustrating an example of an electrical connection between the semiconductor chip 230 and the body 445 shown in FIG. 8A.

As illustrated in FIGS. 8A and 8B, a passive element 460 may be positioned within a lens unit 210 and/or on the body 455. The passive element 460 may include a resistor, a capacitor, an inductor, or the like. An electrode 462 may be formed beneath the passive element 460 and may be electrically connected to a lead 420 by a bonding wire 464.

Bonding wires, bumps, solder balls, ACF or ACP may be used as electrical connection 425.

Figure 9A:
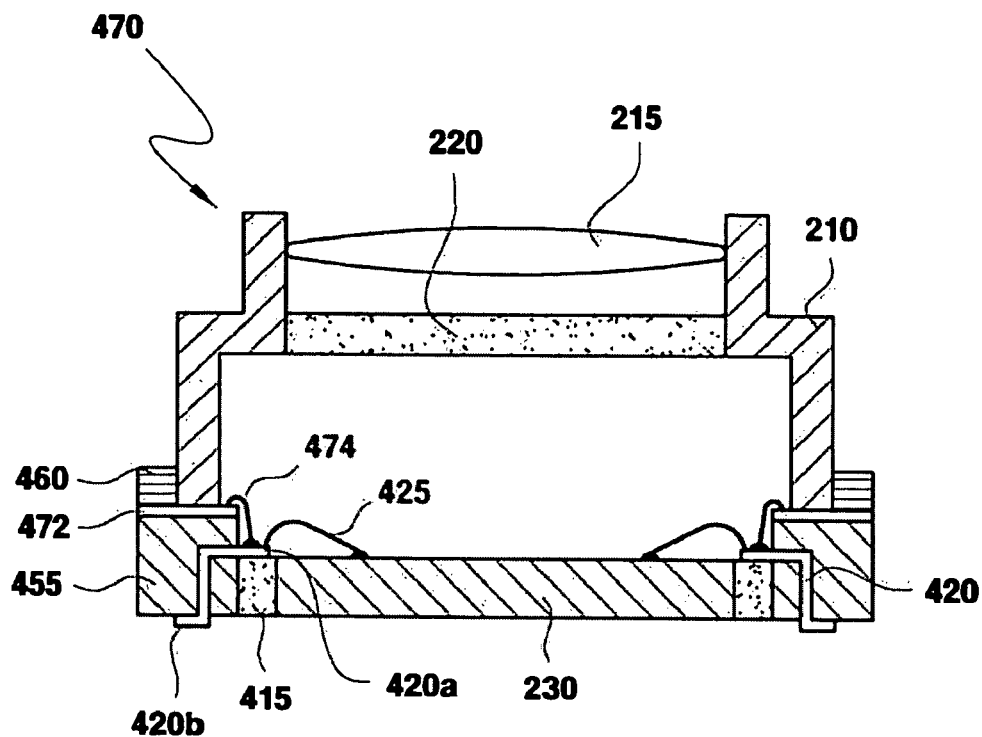
FIG. 9A is a cross-sectional view of a solid-state imaging apparatus according to another exemplary embodiment of the present invention.
Figure 9B:
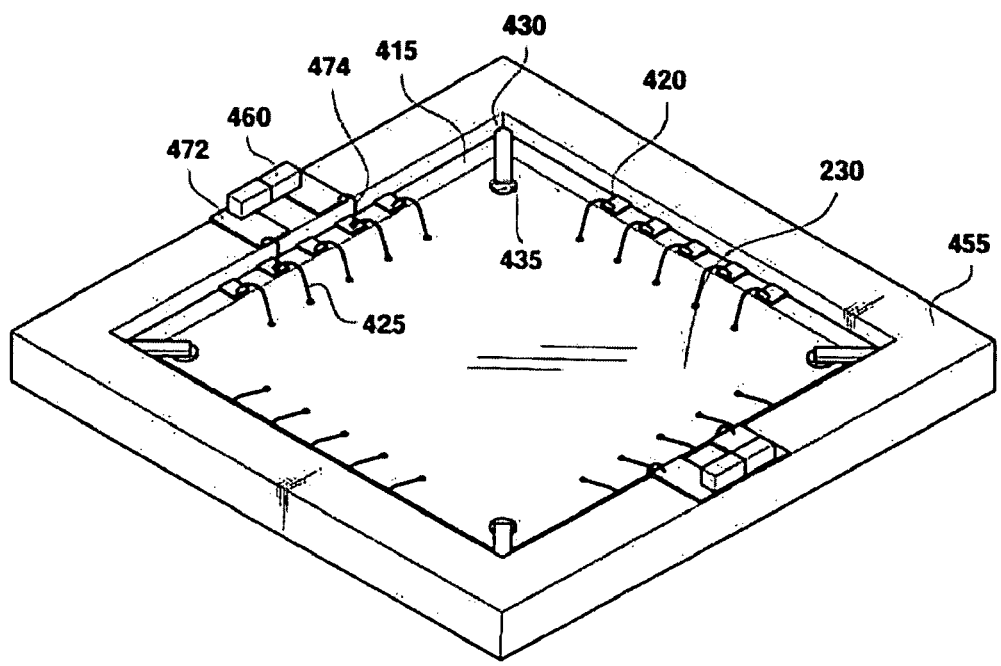
FIG. 9B is a perspective view illustrating an example of an electrical connection between a semiconductor chip and a body shown in FIG. 9A.

FIG. 9A is a cross-sectional view of a solid-state imaging apparatus 470 according to another exemplary embodiment of the present invention, and FIG. 9B is a perspective view illustrating an example of an electrical connection between the semiconductor chip 230 and the body 445 shown in FIG. 9A.

As illustrated in FIGS. 9A and 9B, a passive element 460 may be positioned outside a lens unit 210 and/or on the body 455. The passive element 460 may include a resistor, a capacitor, an inductor, or the like. An electrode 472 may be formed beneath the passive element 460 and may be electrically connected to a lead 420 by a bonding wire 474.

Bonding wires, bumps, solder balls, ACF or ACP may be used as electrical connection 425.

Figure 10A:
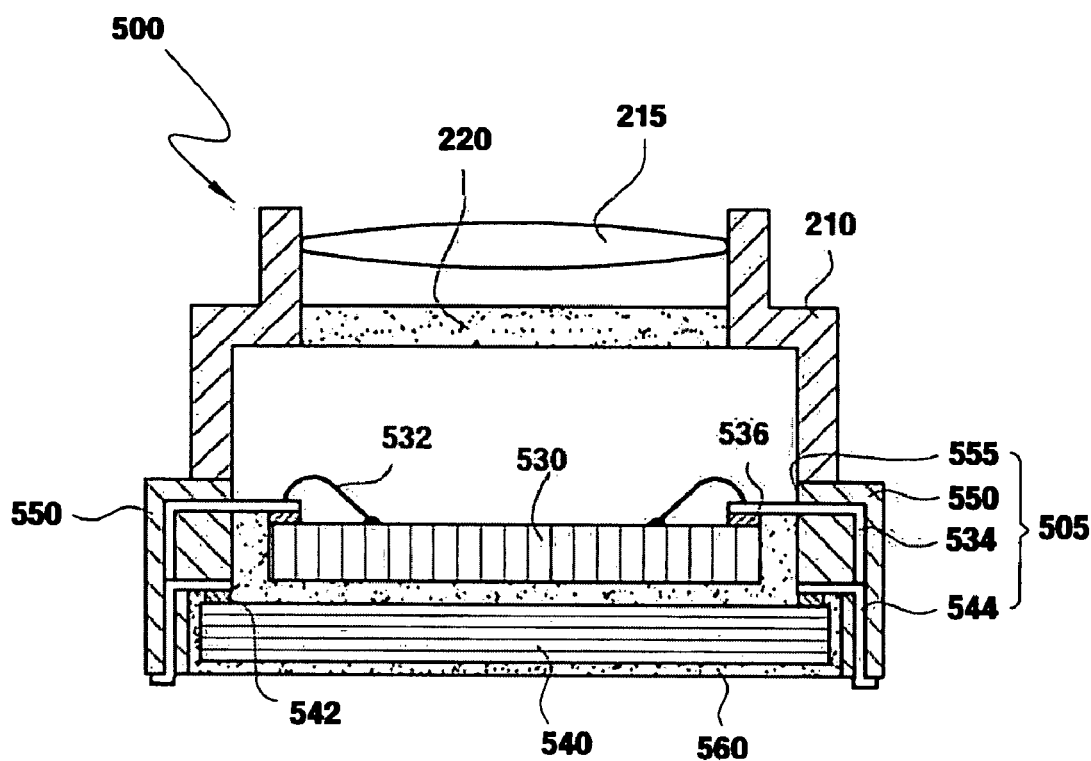
FIG. 10A is a cross-sectional view of a solid-state imaging apparatus according to another exemplary embodiment of the present invention.
Figure 10B:
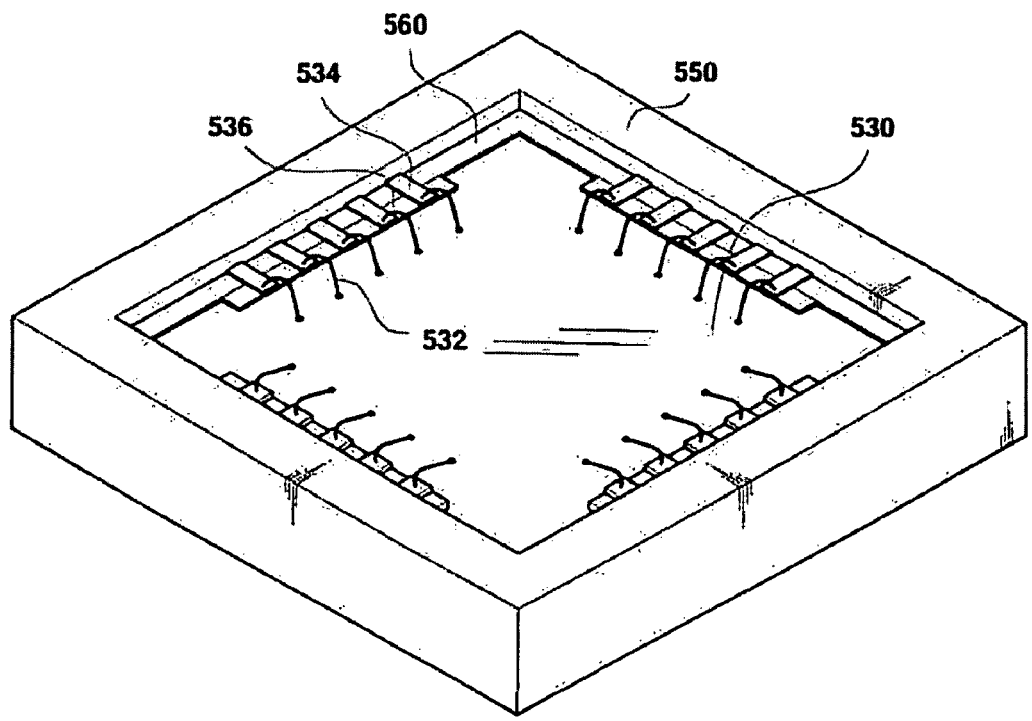
FIG. 10B is a perspective view illustrating an example of an electrical connection between a semiconductor chip and a body shown in FIG. 10A.
Figure 10C:
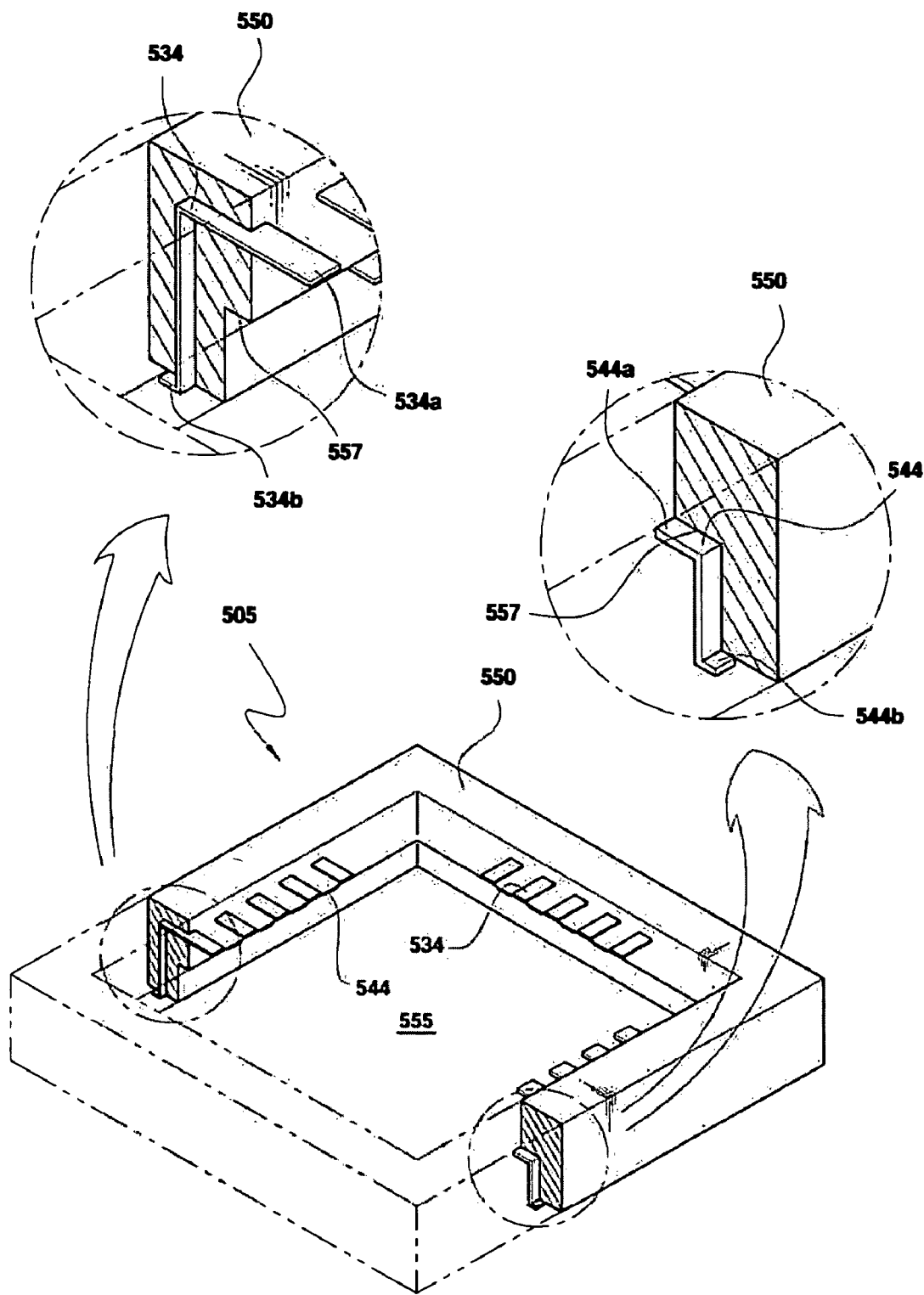
FIG. 10C is a perspective view of a wiring substrate shown in FIG. 10A.

FIG. 10A is a cross-sectional view of a solid-state imaging apparatus 500 according to another exemplary embodiment of the present invention, and FIG. 10B is a perspective view illustrating an example of an electrical connection between semiconductor chips 530, 540 and the body 550 shown in FIG. 10A. FIG. 10C is a perspective view of an exemplary embodiment of a wiring substrate 505 according to the present invention.

As illustrated in FIG. 10A, the solid-state imaging apparatus 500 may include a lens unit 210 capable of holding a solid-state imaging lens 215, a wiring substrate 505, a solid-state imaging semiconductor chip 530 and an image-processing semiconductor chip 540.

Referring to FIGS. 10A through 10C, the wiring substrate 505 may include a body 550, a leads 534 and a 544. The body 550 may be fixed to a lower portion of the lens unit 210 by a sealant. A cavity 555 may be formed within the body 550 directly, or indirectly, under the solid-state imaging. An internal side of the cavity 555 may include a stepped portion.

A lead 534 may be formed through the body 550, and an end 534a of the lead 534 may project into the cavity 555 from an internal side of the body 550. An end 534b of the lead 534 may be connected to a bottom portion of the body 550. The lead 534 may be plated with a metal such as Ni, Au or the like.

As shown in FIG. 10A, the solid-state imaging semiconductor chip 530 may be positioned within the cavity 555 and directly, or indirectly, under the solid-state imaging lens 215. The end 534a of the lead 534 may project into the cavity 555 from the internal side of the body 550 and may be bonded to a portion of the top surface of the solid-state imaging semiconductor chip 530 by a sealant. The solid-state imaging semiconductor chip 530 may be positioned within the cavity 555 and may be fixed to the lead 534. An electrode pad (not shown) may be formed on the solid-state imaging semiconductor chip 530 and may be electrically connected to the end 534a by an electrical connection 532.

The solid-state imaging semiconductor chip 530 may include a group of photoelectrical conversion elements which may photoelectrically convert light from the solid-state imaging lens 215 into an image signal. The solid-state imaging semiconductor chip 530 may form an image of an object on a sensor of the semiconductor chip 230 through the solid-state imaging lens 215 and an IR cut filter 220, photoelectrically convert and output the object image as an image signal in digital and/or analog form. The solid-state imaging semiconductor chip 530 may include a CMOS image sensor (CIS) and/or a charged coupled device (CCD).

Bonding wires, bumps, solder balls, ACF or ACP, or the like may be used as an electrical connection 532.

A lead 544 may be formed through the body 550. An end 544a of the lead 544 may project into the cavity from a stepped portion 557 of an internal side of the body 550. Another end 544b of the lead 544 may connect to a bottom portion of the body 550. The lead 544 may be plated with a metal such as Ni, Au or the like.

As shown in FIG. 10A, the image-processing semiconductor chip 540 may be positioned within the cavity 555 and directly, or indirectly, under the solid-state imaging semiconductor chip 530. The end 544a may project from the stepped portion 557 of the body 550 and may electrically connect to an electrode pad (not shown), which may be formed on an edge of a top portion of the image-processing semiconductor chip 540, by an electrical connection 542.

The image-processing semiconductor chip 540 may be connected to the lead 544 and may allow the image-processing semiconductor chip 540 to be positioned within the cavity 555.

The image-processing semiconductor chip 540 may process image signals from the solid-state imaging semiconductor chip 530.

Bumps, solder balls, ACF or ACP, or the like may be used as the electrical connection 542.

Electrical connections and connected portions of the solid-state imaging semiconductor chip 530, the image-processing semiconductor chip 540 and/or the body 550 may be encapsulated by an insulating encapsulation resin 560. The insulating encapsulation resin 560 may improve the reliability and/or strength of the electrically connected portions. Epoxy resin, silicon resin, or the like may be used as the insulating encapsulation resin 560.

Figure 11A:
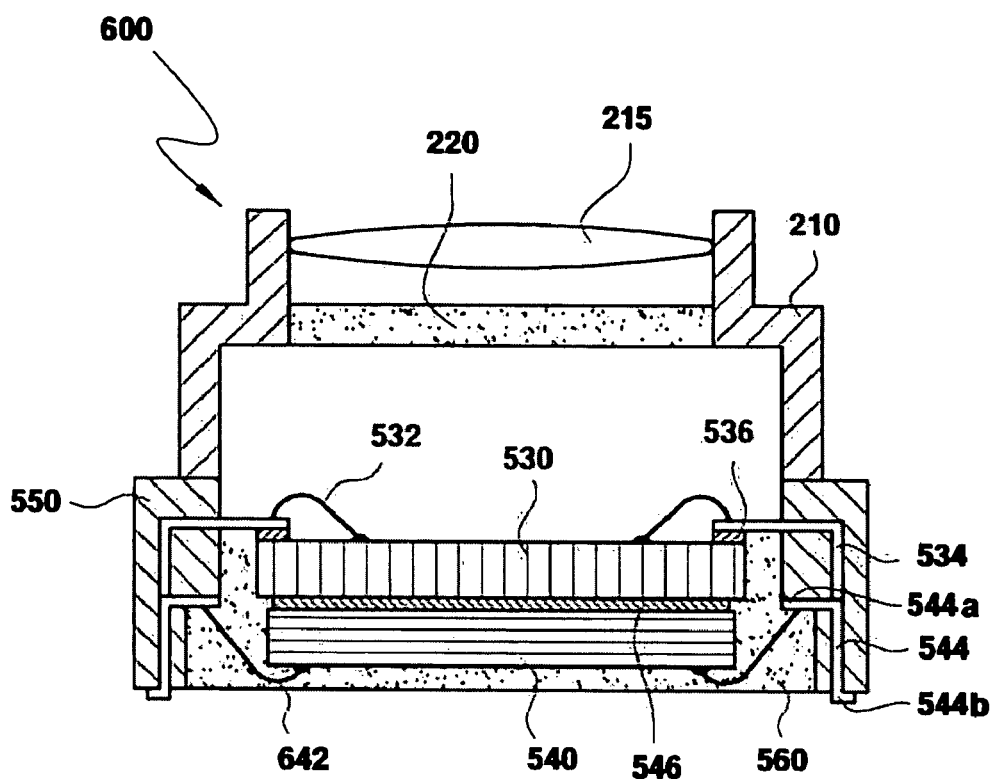
FIG. 11A is a cross-sectional view of a solid-state imaging apparatus according to another exemplary embodiment of the present invention.
Figure 11B:
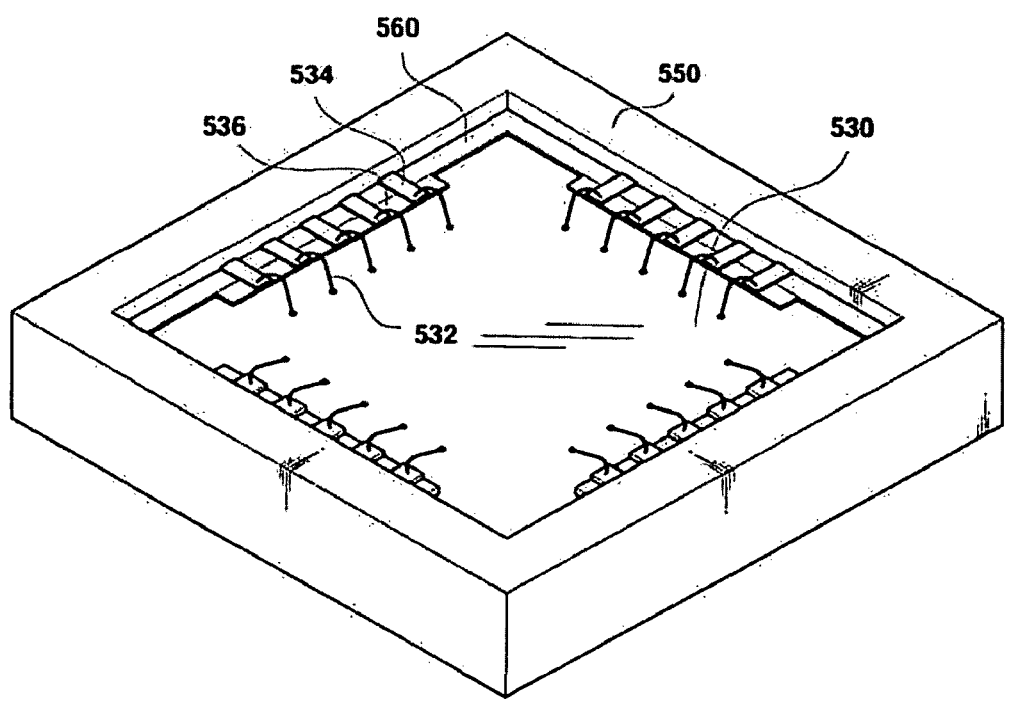
FIG. 11B is a perspective view illustrating an example of an electrical connection between a semiconductor chip and a body shown in FIG. 11A.

FIG. 11A is a cross-sectional view of a solid-state imaging apparatus 600 according to another exemplary embodiment of the present invention, and FIG. 11B is a perspective view illustrating an example of an electrical connection between each of semiconductor chips 530, 540 and the body 550 shown in FIG. 11A. As illustrated in FIGS. 11A and 11B, bonding wires may be used as an electrical connection 642.

As illustrated in FIG. 11A, a plane (for example, a circuit-formed plane) of the image-processing semiconductor chip 540 may face downward and may be fixed to a surface of the solid-state imaging semiconductor chip 530 using a sealant 546. An epoxy resin adhesive which may contain Ag, or the like, may be used as the sealant 546. An end 544a of lead 544 may be electrically connected to an electrode pad (not shown), which may be formed on a surface of the image-processing semiconductor chip 540, by the electrical connection 642.

Figure 12A:
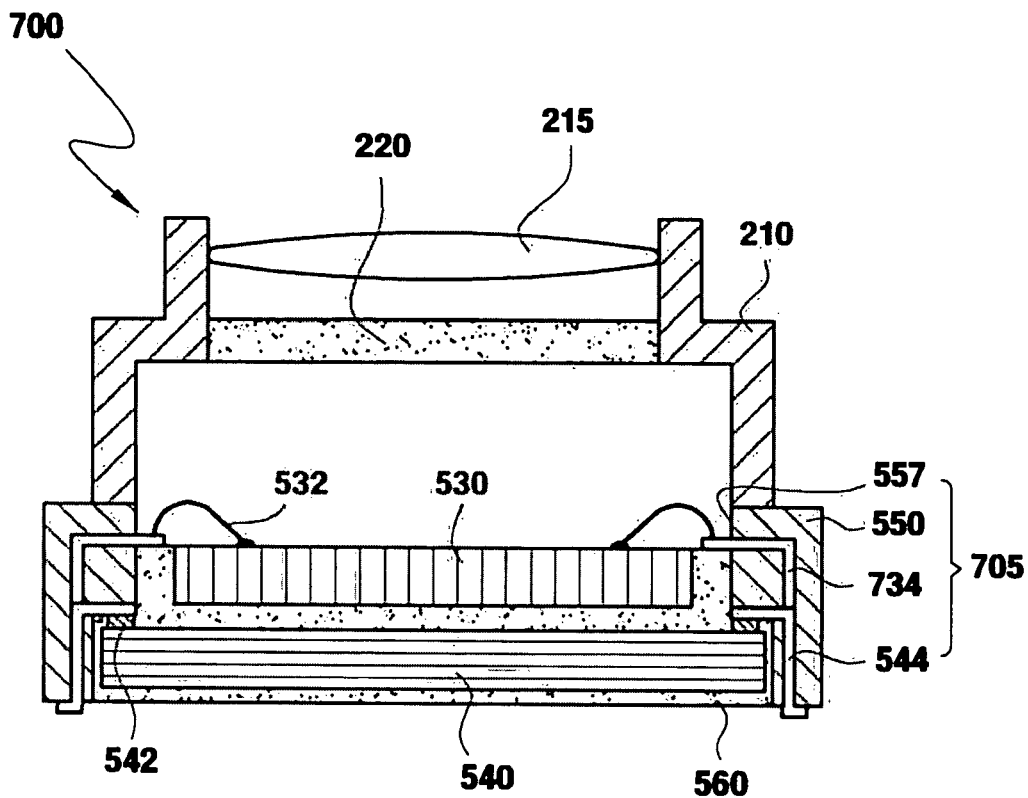
FIG. 12A is a cross-sectional view of a solid-state imaging apparatus according to another exemplary embodiment of the present invention.
Figure 12B:
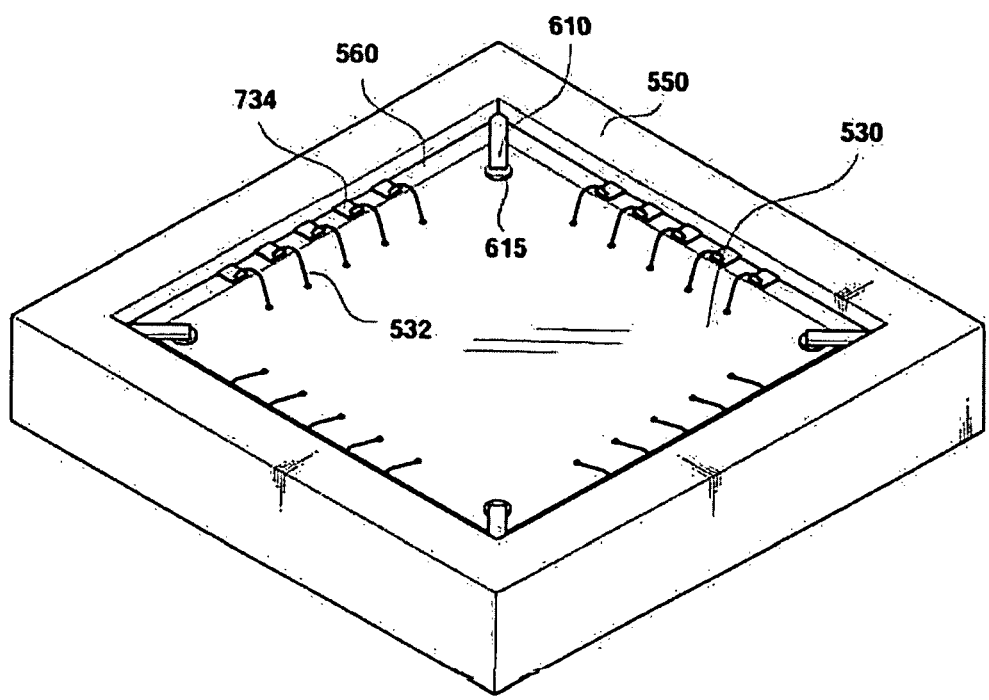
FIG. 12B is a perspective view illustrating an example of an electrical connection between a semiconductor chip and a body shown in FIG. 12A.
Figure 12C:
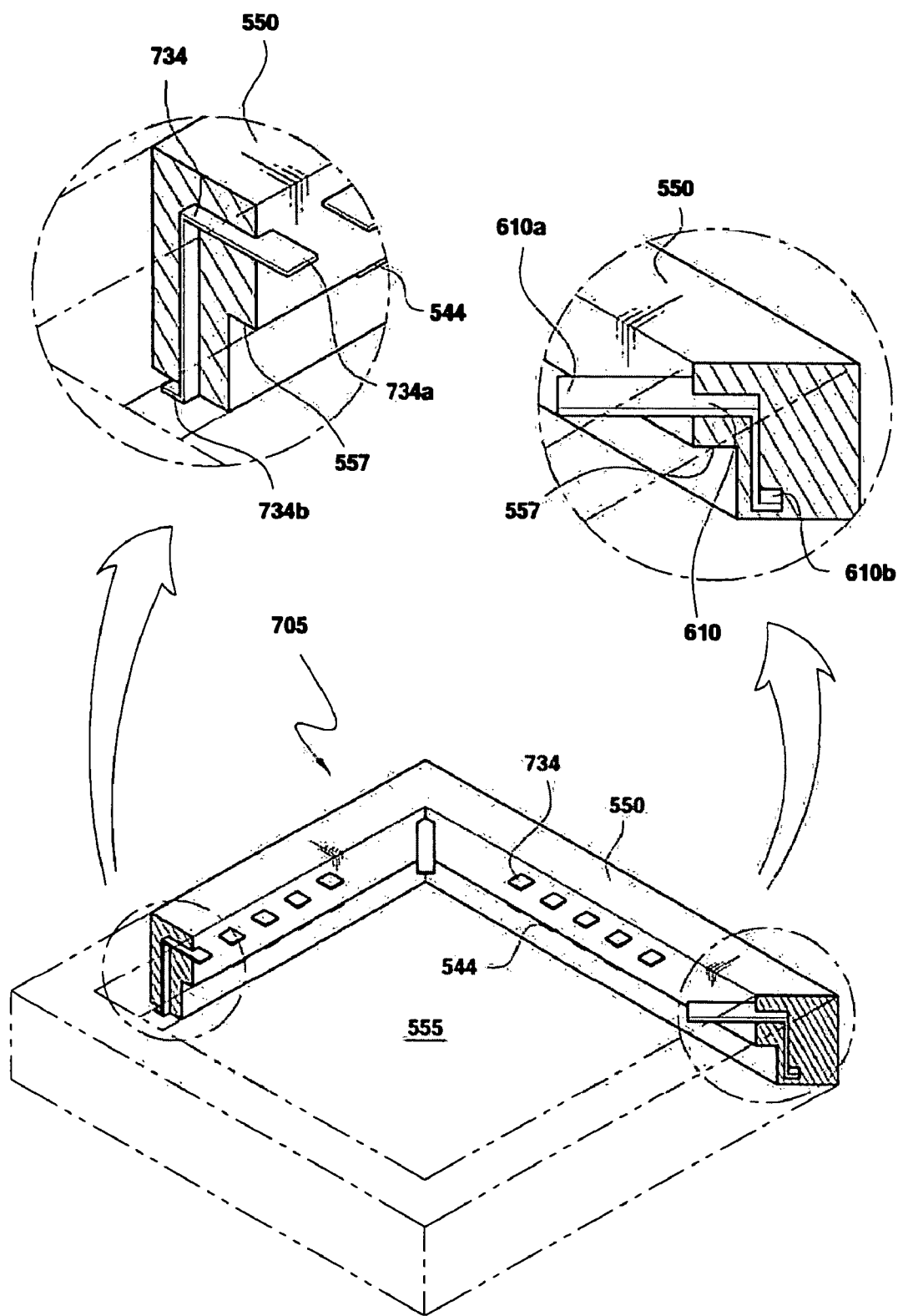
FIG. 12C is a perspective view of a wiring substrate shown in FIG. 12A.
Figure 12D:
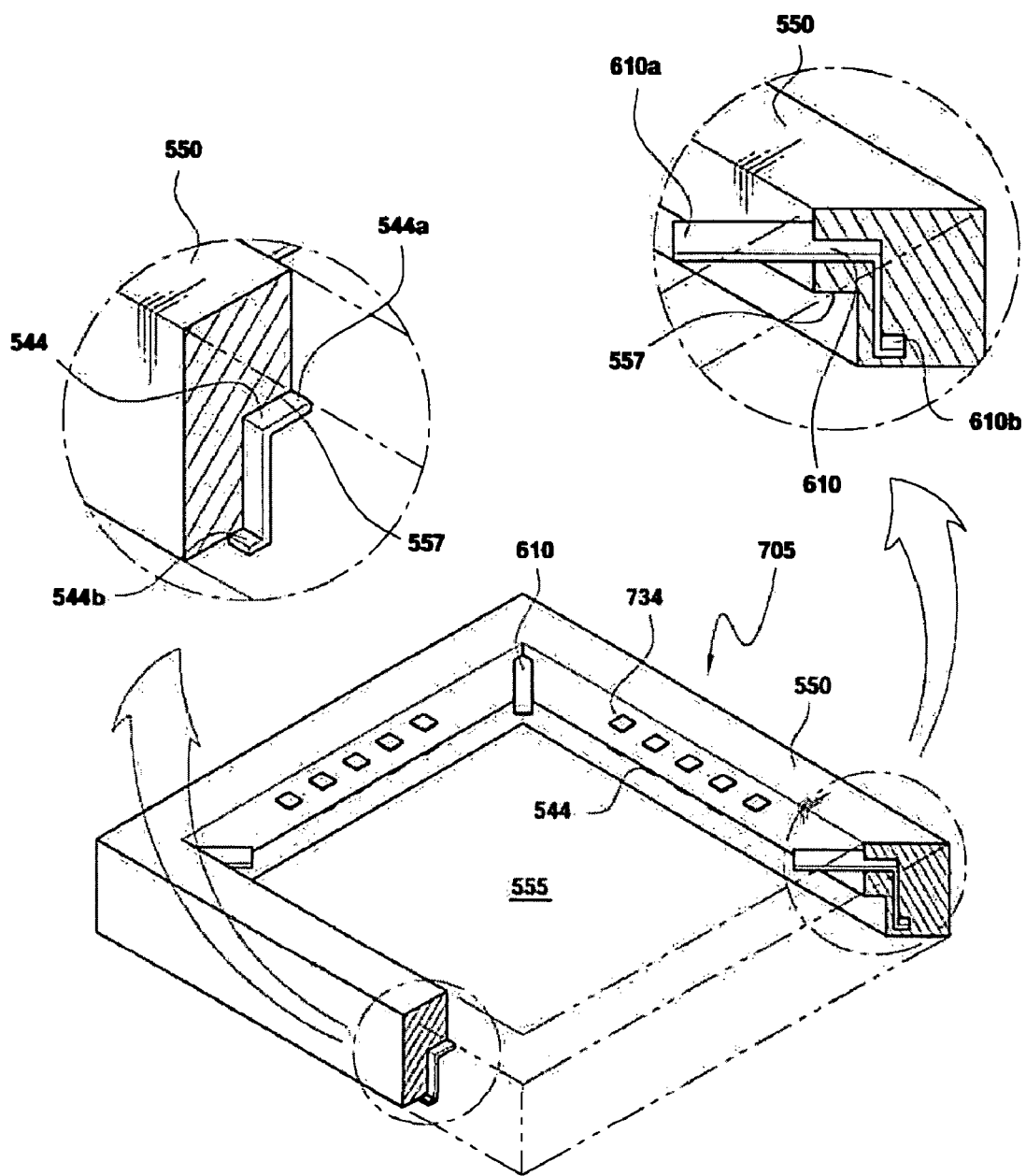
FIG. 12D is another perspective view of a wiring substrate shown in FIG. 12A.

FIG. 12A is a cross-sectional view of a solid-state imaging apparatus 700 according to another exemplary embodiment of the present invention, and FIG. 12B is a perspective view illustrating an example of an electrical connection between each of semiconductor chips 530, 540 and the body 550 shown in FIG. 12A. FIGS. 12C and 12D are perspective views of a wiring substrate 705.

As illustrated in FIGS. 12A through 12D, the solid-state imaging semiconductor chip 530 may be fixed into position by a tie bar 610. An end 610a of the tie bar 610 may project from an upper portion of the internal side of the body 550 and an edge of the end 610a of the tie bar 610 may be fixed to the top surface of the solid-state imaging semiconductor chip 530 by a sealant 615. The end 610b of the tie bar 610 may be positioned within the body 550.

In another exemplary embodiment of the present invention, the wiring substrate 705 may include a body 550, leads 734 and 544, and a tie bar 610. The tie bar 610 may be fixed to four corners of the semiconductor chip 530, and may not overlap the lead 734. The tie bars may fixedly position the solid-state imaging semiconductor chip 530 on the body 550. Tie bar 610 may be formed at the same, or substantially the same, time as the leads 544 and/or 734. The tie bar 610, and leads 544 and 734 may be formed of the same, or substantially the same, material.

As shown in FIG. 12C, the lead 734 may be formed through the body 550, and an end 734a of the lead 734 may project into a cavity 555 from an upper portion of an internal side of the body 550. The other end 734b of the lead 734 may be connected to the bottom of the body 550. One end 734a of the lead 734 may project toward the top surface of the solid-state imaging semiconductor chip 530 and may not be bonded to the top surface of the solid-state imaging semiconductor chip 530.

Bonding wires, bumps, solder balls, ACF or ACP may be used as the electrical connection 532.

Figure 13A:
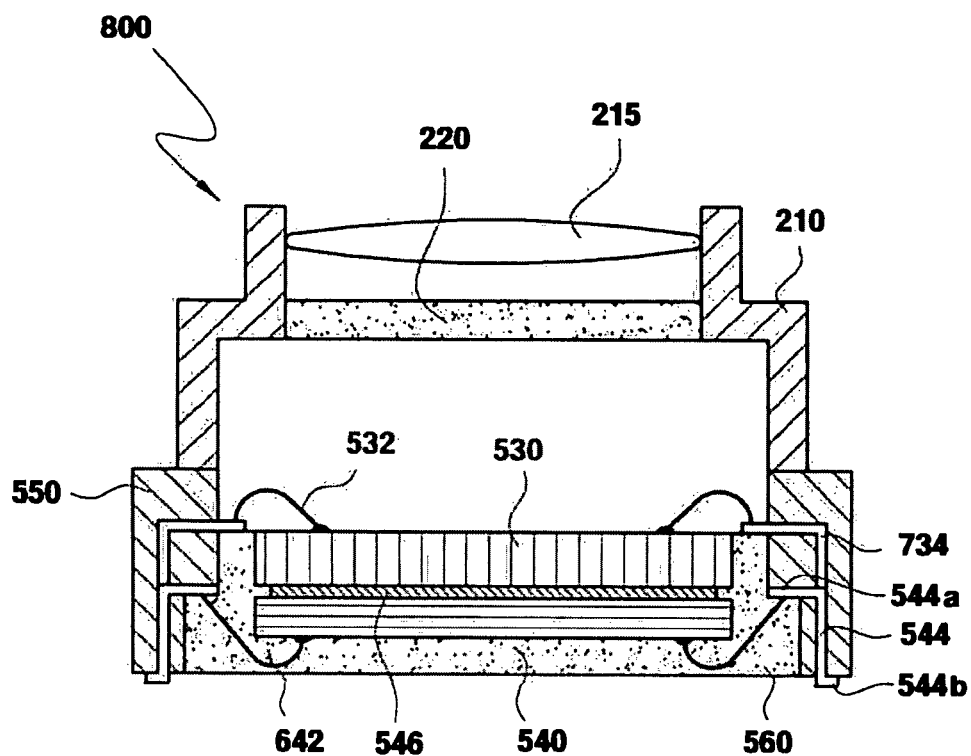
FIG. 13A is a cross-sectional view of a solid-state imaging apparatus according to another exemplary embodiment of the present invention.
Figure 13B:
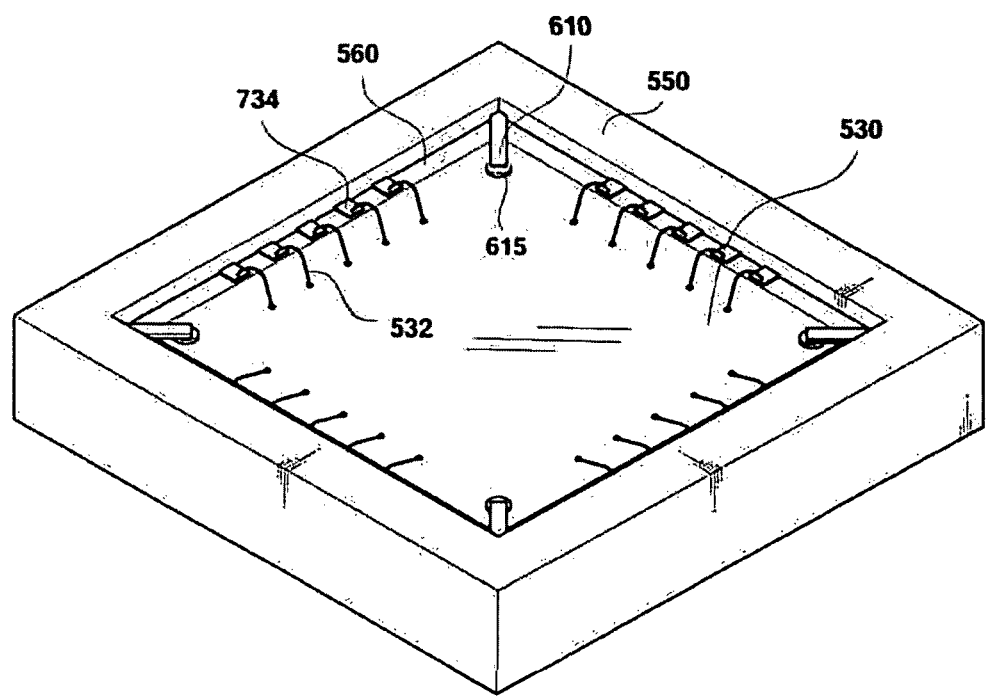
FIG. 13B is a perspective view illustrating an example of an electrical connection between a semiconductor chip and a body shown in FIG. 13A.

FIG. 13A is a cross-sectional view of a solid-state imaging apparatus 800 according to another exemplary embodiment of the present invention, and FIG. 13B is a perspective view illustrating an example of an electrical connection between each of semiconductor chips 530, 540 and the body 550 shown in FIG. 13A.

Bonding wires may be used as an electrical connection 642.

Although exemplary embodiments may have two independent semiconductor chips 530 and 540 which may be integrally formed in the cavity of the wiring substrate, the present invention is not limited thereto. Exemplary embodiments of the present invention may be implemented by connecting two units of the structure in which a single semiconductor chip and/or a wiring substrate may be combined.

As shown in FIG. 13A, a plane (for example, a circuit-formed plane) of the image-processing semiconductor chip 540 may face downward and/or the other plane may be fixed, to a surface of the solid-state imaging semiconductor chip 530 using a sealant 546, which may position the image-processing semiconductor chip 540. An epoxy resin adhesive containing Ag, or the like, may be used as the sealant 546. One end 544a of lead 544 may be electrically connected to an electrode pad (not shown) formed on a surface of the image-processing semiconductor chip 540 by the electrical connection 642.

Although exemplary embodiments of the present invention have been described with the tie bar 430 bonded to four corners of the semiconductor chip, it will be apparent that the number and position of the tie bar may be adjusted, for example, bonded to more than four corners, as desired by one of ordinary skill in the art.

Although exemplary embodiments of the solid-state imaging semiconductor chip have been described as including a CMOS image sensor (CIS) and/or a charged coupled device (CCD), it will be apparent that any similar, or substantially similar, semiconductor chip may be utilized as desired by one of ordinary skill in the art.

Although exemplary embodiments of the present invention have been described as including a solid-state imaging semiconductor chip or device and/or a solid-state image processing semiconductor chip or device, it will be apparent to one of ordinary skill in the art that exemplary embodiments may utilize a combination solid-state imaging and solid-state image processing semiconductor chip or device.

Although exemplary embodiments of the present invention have been described as using epoxy resin and/or silicon resin, it will be apparent that any resin, or the like, which may include an insulating property, may be used as insulating encapsulation resin.

Although exemplary embodiments of the present invention have been described as utilizing, for example a lead and/or a tie bar, it will be understood that 'a' or 'an' may describe one or more. For example, a lead may be one or more leads, and a tie bar may be one or more tie bars.

While exemplary embodiments of the present invention have been particularly shown and described, it will be understood by those skilled in the art that the foregoing and other changes in form and details may be made therein without departing from the spirit and scope of the invention which should be limited only by the scope of the appended claims. Thus, exemplary embodiments of the present invention disclosed above are used in a generic and descriptive sense only and not for purposes of limitation.

As described above, in a solid-state imaging apparatus according to exemplary embodiments of the present invention, a cavity may be formed in a body and a solid-state imaging chip and/or an image processing semiconductor chip may be placed within the cavity, thereby making the solid-state imaging apparatus which may be thinner and have a smaller mounting area. A lead electrically connected to a semiconductor chip may be formed on the body and/or a portion and may project toward the semiconductor chip, which may reduce the need for separate space on the body for sealing the lead and the semiconductor chip. Thus, a length of the body and/or the solid-state imaging apparatus may be reduced.

What is claimed is:

1. A wiring substrate, comprising:
a body forming an open-assembly, including an opening in which a semiconductor chip is positioned, a bottom surface of the semiconductor chip being substantially flush with a bottom surface of the body; and
a lead disposed through the body; wherein
a first end of the lead projects into the open-assembly from an internal side of the body, an upper side and a lower side of the first end not surrounded by the body, and a second end of the lead is connected to a bottom portion of the body.

2. The wiring substrate of claim 1, further comprising a tie bar projecting into the open-assembly from the internal side of the body and having a leading edge adhered to a top surface of the semiconductor chip.

3. A solid-state imaging apparatus including the wiring substrate of claim 1.

4. A wiring substrate, comprising:
a body forming an open-assembly that includes an opening in which a top semiconductor chip and a bottom semiconductor chip are positioned, and a stepped portion formed on an internal surface of the body, the stepped portion widening the opening near the bottom of the body;
a first lead disposed through the body; and
a second lead disposed through the body; wherein
the first lead includes a first end projecting into the opening from an internal side of the body and a second end connected to a bottom portion of the body; and
the second lead includes third end projecting into the opening from the stepped portion of the body and a fourth end connected to a bottom portion of the body.

5. The wiring substrate of claim 4, further comprising a tie bar projecting into the opening from the internal side of the body and including an edge adhered to a top surface of the top semiconductor chip.

6. A solid-state imaging apparatus including the wiring substrate of claim 4.

7. A solid-state imaging apparatus, comprising:
a lens unit capable of holding a solid-state imaging lens;
a wiring substrate, including a body forming an open-assembly that includes an opening in which a semiconductor chip is positioned, and a lead disposed through the body including a first end projecting into the opening from an internal side of the body, an upper side and a lower side of the first end not surrounded by the body, and a second end connected to a bottom portion of the body; wherein the wiring substrate is connected to the lens unit such that the solid-state imaging lens and the opening face each other, and wherein the semiconductor chip is electrically connected to the first end of the lead and adapted to convert light from the solid-state imaging lens into an image signal and process the image signal, wherein a bottom surface of the semiconductor chip is substantially flush with a bottom surface of the body.

8. The wiring substrate of claim 7, further comprising a tie bar projecting into the opening from the internal side of the body and including a leading edge adhered to a top surface of the semiconductor chip.

9. The wiring substrate of claim 8, wherein the tie bar and the lead are formed of substantially the same material.

10. The solid-state imaging apparatus of claim 8, wherein the first end of the lead and the semiconductor chip are electrically connected to each other by at least one electrical connection selected from the group of bonding wires, bumps, solder balls, an anisotropic conductive film (ACF) and an anisotropic conductive paste (ACP).

11. The solid-state imaging apparatus of claim 10, wherein a connected portion between the semiconductor chip and the body is encapsulated by an insulating encapsulation resin.

12. The solid-state imaging apparatus of claim 10, further comprising an IR cut filter, spaced apart from and placed between the solid-state imaging lens and the semiconductor chip, and fixedly positioned in the lens unit.

13. The solid-state imaging apparatus of claim 7, wherein the first end of the lead is adhered to the top surface of the semiconductor chip.

14. The solid-state imaging apparatus of claim 13, wherein the first end of the lead and the semiconductor chip are electrically connected to each other by at least one electrical connection selected from the group of bonding wires, bumps, solder balls, an anisotropic conductive film (ACF) and an anisotropic conductive paste (ACP).

15. The solid-state imaging apparatus of claim 14, wherein a connected portion between the semiconductor chip and the body is encapsulated by an insulating encapsulation resin.

16. The solid-state imaging apparatus of claim 14, further comprising an IR cut filter, spaced apart from and placed between the solid-state imaging lens and the semiconductor chip, and fixedly positioned in the lens unit.

17. A solid-state imaging apparatus, comprising:
a lens unit capable of holding a solid-state imaging lens;
a wiring substrate, including a body which forms an open-assembly, which includes an opening in which a top semiconductor chip is positioned and a stepped portion formed an internal surface of the body;
a first lead disposed through the body;
a second lead disposed through the body;
a bottom semiconductor chip; wherein a first end of the first lead projects into the opening from an internal side of the body and a second end is connected to a bottom portion of the body, a third end of the second lead projects into the opening from the stepped portion of the body and a fourth end of the second lead is connected to the bottom portion of the body, the top semiconductor chip is placed within the opening and electrically connected to the first end of the first lead, and adapted to convert light from the solid-state imaging lens into an image signal, and the bottom semiconductor chip is placed under the top semiconductor chip within the opening and electrically connected to the third end of the second lead, and adapted to process the image signal wherein the stepped portion widens the opening near the bottom of the body.

18. The solid-state imaging apparatus of claim 17, wherein the one end of the first lead is adhered to the top surface of the top semiconductor chip.

19. The solid-state imaging apparatus of claim 18, wherein the first end of the first lead and the top semiconductor chip are electrically connected to each other by at least one electrical connection selected from the group of bonding wires, bumps, solder balls, an anisotropic conductive film (ACF) and an anisotropic conductive paste (ACP).

20. The solid-state imaging apparatus of claim 19, wherein the third end of the second lead and the bottom semiconductor chip are electrically connected to each other by at least one electrical connection selected from the group of bonding wires, bumps, solder balls, an anisotropic conductive film (ACF) and an anisotropic conductive paste (ACP).

21. The solid-state imaging apparatus of claim 19, wherein a connected portion between the top semiconductor chip and the body is encapsulated by an insulating encapsulation resin.

22. The solid-state imaging apparatus of claim 19, further comprising an IR cut filter, spaced apart from and placed between the solid-state imaging lens and the top semiconductor chip, and fixedly positioned in the lens unit.

23. The wiring substrate of claim 17, further comprising a tie bar projecting into the opening from the internal side of the body and having a leading edge adhered to a top surface of the top semiconductor chip.

24. The wiring substrate of claim 23, wherein the tie bar and the lead are formed of substantially the same material.

25. The solid-state imaging apparatus of claim 23, wherein the first end of the first lead and the top semiconductor chip are electrically connected to each other by at least one electrical connection selected from the group of bonding wires, bumps, solder balls, an anisotropic conductive film (ACF) and an anisotropic conductive paste (ACP).

26. The solid-state imaging apparatus of claim 25, wherein the third end of the second lead and the bottom semiconductor chip are electrically connected to each other by at least one electrical connection selected from the group of bonding wires, bumps, solder balls, an anisotrcpic conductive film (ACF) and an anisotropic conductive paste (ACP).

27. The solid-state imaging apparatus of claim 25, wherein a connected portion between the top semiconductor chip and the body is encapsulated by an insulating encapsulation resin.

28. The solid-state imaging apparatus of claim 25, further comprising an IR cut filter, spaced apart from and placed between the solid-state imaging lens and the top semiconductor chip, and fixedly positioned in the lens unit.

29. A wiring substrate, comprising:
a body forming an open-assembly that includes an opening in which a semiconductor chip is positioned, a bottom surface of the semiconductor chip being substantially flush with a bottom surface of the body; and at least one lead disposed through the body; wherein at least a first end of the at least one lead projects into the opening from at least one of an internal side of the body, an upper side and a lower side of the first end not surrounded by the body, and a top portion of the body and at least a second end is connected to a bottom portion of the body.

30. The wiring substrate of claim 29, further comprising
at least one tie bar, wherein at least one of the at least one lead and the
at least one tie bar fixedly position the semiconductor chip within the opening.

31. The wiring substrate of claim 30, wherein at least the first end of the lead projects into the opening from the top portion of the body.

32. The wiring substrate of claim 29, wherein the at least one lead is adapted to fixedly position the semiconductor chip within the opening.

33. The wiring substrate of claim 29, further comprising at least one tie bar adapted to fixedly position the semiconductor chip within the opening.

34. The wiring substrate of claim 29, wherein at least the first end of the lead projects into the opening from the top portion of the body.

35. The wiring substrate of claim 29, wherein the at least one semiconductor chip is comprised of at least one of a solid-state semiconductor chip, solid-state image processing semiconductor chip, and combination solid-state semiconductor chip and solid-state image processing semiconductor chip.

36. A solid-state imaging apparatus including the wiring substrate of claim 29.

37. A solid-state imaging apparatus comprising:
a lens unit capable of holding a solid-state imaging lens;
a body forming an open-assembly which includes an opening, in which at least one semiconductor chip is positioned, a bottom surface of one of the at least one semiconductor chips being substantially flush with a bottom surface of the body; and at least one lead disposed through the body, wherein at least a first end of the at least one lead projects into the opening from at least one of an internal side of the body and a top portion of the body and at least a second end connected to a bottom portion of the body.

38. The solid-state imaging apparatus of claim 37, further comprising
at least one tie bar, wherein at least one of the at least one lead and the at least
one tie bar fixedly position the semiconductor chip within the opening.

39. The wiring substrate of claim 38, wherein at least the first end of the lead projects into the opening from the top portion of the body.

40. The solid-state imaging apparatus of claim 37, wherein the at least one lead is adapted to fixedly position the semiconductor chip within the opening.

41. The solid-state imaging apparatus of claim 37, further comprising at least one tie bar adapted to fixedly position the semiconductor chip within the opening.

42. The solid-state imaging apparatus of claim 37, wherein at least the first end of the lead projects into the opening from the top portion of the body.

43. The solid-state imaging apparatus of claim 37, wherein the at least one semiconductor chip is comprised of at least one of a solid-state semiconductor chip, solid-state image processing semiconductor chip, and combination solid-state semiconductor chip and solid-state image processing semiconductor chip.

44. The solid-state imaging apparatus of claim 37, further comprising
a passive element positioned inside the lens unit and electrically connected to the at least one lead.

45. The solid-state imaging apparatus of claim 37, further comprising
a passive element positioned outside the lens unit and electrically connected to the at least one lead.

46. A method of manufacturing a wiring substrate, comprising:
forming an open-assembly by providing an opening within a body;
mounting a semiconductor chip, within the opening, a bottom surface of the semiconductor chip being substantially flush with a bottom surface of the body; and
forming at least one lead through the body; further including
forming at least a first end of the lead projecting into the opening from at least one of an internal side and a top portion of the body, an upper side and a lower side of the first end not surrounded by the body, and
forming at least a second end of the lead connecting to a bottom portion of the body.

47. The method of manufacturing the wiring substrate of claim 46, further comprising
fixedly positioning the semiconductor chip within the opening by either the lead or at least one tie bar.

48. The method of manufacturing the wiring substrate of claim 46, further comprising
fixedly positioning the semiconductor chip within the opening by the at least one lead and at least one tie bar.

49. A method of manufacturing a solid-state imagining apparatus, comprising:
mounting a lens unit on the body of the wiring substrate of claim 46, the lens unit capable of holding a solid-state imaging lens.

50. A method of manufacturing a solid-state imaging apparatus, comprising:
forming an open-assembly by providing an opening within a body;
mounting at least one semiconductor chip, within the opening, a bottom surface of one of the at least one semiconductor chips being substantially flush with a bottom surface of the body;
mounting a lens unit on the body, the lens unit capable of holding a solid-state imaging lens; and
forming at least one lead through the body; further including
forming at least a first end of the lead projecting into the opening from at least one of an internal side and a top portion of the body, and
forming at least a second end of the lead connecting to a bottom portion of the body.

51. The method of manufacturing a solid-state imaging apparatus of claim 50, further comprising
fixedly positioning the at least one semiconductor chip within the opening by at least one of the lead and at least one tie bar.

52. The method of manufacturing a solid-state imaging apparatus of claim 50, further comprising
fixedly positioning the at least one semiconductor chip within the opening by the at least one lead.

53. The method of manufacturing a solid-state imaging apparatus of claim 50, further comprising
fixedly positioning the at least one semiconductor chip within the opening by at least one tie bar.

54. The method of manufacturing a solid-state imaging apparatus of claim 50, further comprising
fixedly positioning a passive element within inside the lens unit, and electrically connecting the passive element to the at least one lead.

55. The method of manufacturing a solid-state imaging apparatus of claim 50, further comprising
fixedly positioning a passive element outside the lens unit and electrically connecting the passive element to the at least one lead.

56. A wiring substrate, comprising:
a body forming an open-assembly that includes an opening in which a top semiconductor chip and a bottom semiconductor chip are positioned, wherein a stepped portion widens the opening near the bottom of the body; and
at least one lead disposed through the body; wherein at least a first end of the at least one lead projects into the opening from at least one of an internal side of the body, an upper side and a lower side of the first end not surrounded by the body, and a top portion of the body and at least a second end is connected to a bottom portion of the body.

57. A solid-state imaging apparatus including the wiring substrate of claim 56.

58. A solid-state imaging apparatus comprising:
a lens unit capable of holding a solid-state imaging lens;
a body forming an open-assembly which includes an opening in which a top semiconductor chip and a bottom semiconductor chip are positioned;
at least one lead disposed through the body, wherein at least a first end of the at least one lead projects into the opening from at least one of an internal side of the body and a top portion of the body and at least a second end connected to a bottom portion of the body; and
a stepped portion formed on an internal surface of the body, the stepped portion widening the opening near the bottom of the body.

59. A method of manufacturing a wiring substrate, comprising:
forming an open-assembly by providing an opening within a body;
mounting a top semiconductor chip and a bottom semiconductor chip within the opening, wherein a stepped portion widens the opening near the bottom of the body; and
forming at least one lead through the body; further including
forming at least a first end of the lead projecting into the opening from at least one of an internal side and a top portion of the body, an upper side and a lower side of the first end not surrounded by the body, and
forming at least a second end of the lead connecting to a bottom portion of the body.

60. A method of manufacturing a solid-state imaging apparatus, comprising:
forming an open-assembly by providing an opening within a body;
mounting a top semiconductor chip and a bottom semiconductor chip within the opening;

forming a stepped portion on an internal surface of the body, the stepped portion widening the opening near the bottom of the body;

mounting a lens unit on the body, the lens unit capable of holding a solid-state imaging lens; and forming at least one lead through the body; further including forming at least a first end of the lead projecting into the opening from at least one of an Internal side and a top portion of the body, and forming at least a second end of the lead connecting to a bottom portion of the body.

* * * * *